(12) United States Patent
Broyde et al.

(10) Patent No.: US 10,008,777 B1
(45) Date of Patent: Jun. 26, 2018

(54) METHOD FOR AUTOMATICALLY ADJUSTING A TUNABLE PASSIVE ANTENNA AND A TUNING UNIT, AND APPARATUS FOR RADIO COMMUNICATION USING THIS METHOD

(71) Applicant: TEKCEM, Maule (FR)

(72) Inventors: Frédéric Broyde, Maule (FR); Evelyne Clavelier, Maule (FR)

(73) Assignee: Tekcem (FR)

( * ) Notice: Subject to any disclaimer, the term of this patent is extended or adjusted under 35 U.S.C. 154(b) by 0 days. days.

(21) Appl. No.: 15/782,320

(22) Filed: Oct. 12, 2017

Related U.S. Application Data

(63) Continuation of application No. PCT/IB2017/056003, filed on Sep. 29, 2017.

(30) Foreign Application Priority Data

Apr. 13, 2017 (FR) ..................................... 17 70375

(51) Int. Cl.
*H01Q 11/12* (2006.01)
*H04B 1/04* (2006.01)
(Continued)

(52) U.S. Cl.
CPC ........... *H01Q 9/0442* (2013.01); *H01Q 7/005* (2013.01); *H01Q 21/0006* (2013.01);
(Continued)

(58) Field of Classification Search
CPC .. H01Q 9/0442; H01Q 7/005; H01Q 21/0006; H03J 1/0008; H04B 1/0458; H04B 1/18
See application file for complete search history.

(56) References Cited

U.S. PATENT DOCUMENTS 5,225,847 A 7/1993 Roberts et al.
5,564,086 A 10/1996 Cygan et al.
(Continued)

FOREIGN PATENT DOCUMENTS

FR 3018973 A1 9/2015
WO WO2015/140660 A1 9/2015

OTHER PUBLICATIONS

Broyde et al, "Some Properties of Multiple-Antenna-Port and Multiple-User-Port Antenna Tuners", IEEE Trans. on Circuits and Systems—I: Regular Papers, vol. 62, No. 2, pp. 423-432, Feb. 2015.
(Continued)

*Primary Examiner* — Nguyen Vo
(74) *Attorney, Agent, or Firm* — Barnes & Thornburg LLP

(57) ABSTRACT

The invention relates to a method for automatically adjusting one or more tunable passive antennas and a single-input-port and single-output-port tuning unit. The invention also relates to an apparatus for radio communication using this method, for instance a radio transceiver. An apparatus for radio communication of the invention comprises: a tunable passive antenna; a feeder; a single-input-port and single-output-port tuning unit having an input port and an output port; a sensing unit; a transmission and signal processing unit which applies an excitation to the input port, which delivers one or more antenna adjustment instructions, and which delivers one or more tuning unit adjustment instructions; and a control unit which delivers one or more antenna control signals to the tunable passive antenna, and one or more tuning control signals to the single-input-port and single-output-port tuning unit.

20 Claims, 10 Drawing Sheets

(51) Int. Cl.
*H01Q 9/04* (2006.01)
*H01Q 7/00* (2006.01)
*H03J 1/00* (2006.01)
*H04B 1/18* (2006.01)
*H01Q 21/00* (2006.01)

(52) U.S. Cl.
CPC .......... *H03J 1/0008* (2013.01); *H04B 1/0458* (2013.01); *H04B 1/18* (2013.01)

(56) References Cited

U.S. PATENT DOCUMENTS

| | | | |
|---|---|---|---|
| 6,414,562 B1 | 7/2002 | Bouisse et al. | |
| 7,463,870 B2 | 12/2008 | Peusens et al. | |
| 8,325,097 B2 | 12/2012 | McKinzie, III et al. | |
| 9,628,135 B1 * | 4/2017 | Broyde | H04B 1/40 |
| 9,680,510 B2 | 6/2017 | Broyde et al. | |
| 9,825,364 B2 * | 11/2017 | O'Driscoll | H01Q 1/273 |
| 2008/0186105 A1 * | 8/2008 | Scuderi | H03H 7/40 333/17.3 |
| 2014/0227981 A1 * | 8/2014 | Pecen | H04B 1/0458 455/77 |
| 2015/0078485 A1 * | 3/2015 | Broyde | H04B 1/0458 375/297 |
| 2016/0043751 A1 * | 2/2016 | Broyde | H01Q 1/52 455/77 |
| 2017/0063344 A1 | 3/2017 | Broyde et al. | |
| 2017/0294891 A1 * | 10/2017 | McKinzie, III | H03H 7/40 |

OTHER PUBLICATIONS

Broyde et al., "A Tuning Computation Technique for a Multiple-Antenna-Port and Multiple-User-Port Antenna Tuner", International Journal of Antennas and Propagation, 2016.

"IEC Multilingual Dictionary of Electricity", Bureau Central de la Commission Electrotechnique Internationale, 1983.

Petosa, "An Overview of Tuning Techniques for Frequency-Agile Antennas", IEEE Antennas and Propagation Magazine, vol. 54, No. 5, pp. 271-296, Oct. 2012.

International Search Report relating to PCT/IB2017/056003, dated Feb. 2, 2018.

Information on Search Strategy relating to PCT/IB2017/056003, dated Feb. 2, 2018.

Written Opinion relating to PCT/IB2017/056003, dated Feb. 2, 2018.

Broyde et al, "Two Multiple-Antenna-Port and Multiple-User-Port Antenna Tuners", proceedings of the 9th European Conference on Antenna and Propagation, EuCAP 2015, Apr. 2015.

* cited by examiner ns", published in *IEEE Antennas and Propagation Magazine*, vol. 54, No. 5, in October 2012. As explained in this article, many different types of antenna control device may be used to control one or more characteristics of a tunable passive antenna. An antenna control device may for instance be:

an electrically controlled switch or change-over switch, in which case a parameter of the antenna control device having an effect on one or more characteristics of the tunable passive antenna may be the state of the switch or change-over switch;

an adjustable impedance device, in which case a parameter of the antenna control device having an effect on one or more characteristics of the tunable passive antenna may be the reactance or the impedance of the adjustable impedance device at a specified frequency; or an actuator arranged to produce a mechanical deformation of the tunable passive antenna, in which case a parameter of the antenna control device having an effect on one or more characteristics of the tunable passive antenna may be a length of the deformation.

If an antenna control device is an electrically controlled switch or change-over switch, it may for instance be an electro-mechanical relay, or a microelectromechanical switch (MEMS switch), or a circuit using one or more PIN diodes or one or more insulated-gate field-effect transistors (MOSFETs) as switching devices.

An adjustable impedance device is a component comprising two terminals which substantially behave as the terminals of a passive linear two-terminal circuit element, and which are consequently characterized by an impedance which may depend on frequency, this impedance being adjustable.

An adjustable impedance device having a reactance which is adjustable by electrical means may be such that it only provides, at a given frequency, a finite set of reactance values, this characteristic being for instance obtained if the adjustable impedance device is:

a network comprising a plurality of capacitors or open-circuited stubs and one or more electrically controlled switches or change-over switches, such as electro-mechanical relays, or microelectromechanical switches, or PIN diodes or insulated-gate field-effect transistors, used to cause different capacitors or open-circuited stubs of the network to contribute to the reactance; or a network comprising a plurality of coils or short-circuited stubs and one or more electrically controlled switches or change-over switches used to cause different coils or short-circuited stubs of the network to contribute to the reactance.

An adjustable impedance device having a reactance which is adjustable by electrical means may be such that it provides, at a given frequency, a continuous set of reactance values, this characteristic being for instance achievable if the adjustable impedance device is based on the use of a variable capacitance diode; or a MOS varactor; or a microelectromechanical varactor (MEMS varactor); or a ferroelectric varactor.

Many methods exist for automatically adjusting one or more tunable passive antennas. Some of these methods are applicable to a radio transmitter, for instance the method disclosed in the patent of the U.S. Pat. No. 5,225,847 entitled "Automatic antenna tuning system". Some of these methods are applicable to a radio receiver, for instance the method disclosed in the patent of the U.S. Pat. No. 7,463,870 entitled "Receiver circuit and control method".

A first example of a method for automatically adjusting a tunable passive antenna, applicable to a radio transmitter, is implemented in the automatic antenna system shown in FIG. 1. This automatic antenna system is similar to the one disclosed in said patent of the U.S. Pat. No. 5,225,847. The automatic antenna system shown in FIG. 1 has a user port (31), the user port presenting, at a given frequency, an impedance referred to as "the impedance presented by the user port", the automatic antenna system comprising:

a tunable passive antenna (1), the tunable passive antenna comprising at least one antenna control device, one or more characteristics of the tunable passive antenna being controlled by utilizing said at least one antenna control device, said at least one antenna control device having at least one parameter having an effect on said one or more characteristics, said at least one parameter being adjustable by electrical means;

a sensing unit (3) delivering two "sensing unit output signals", each of the sensing unit output signals being determined by one electrical variable sensed (or measured) at the user port;

a feeder (2) having a first end coupled to a signal port of the tunable passive antenna, the feeder having a second end coupled to the user port, through the sensing unit;

a signal processing unit (5), the signal processing unit estimating q real quantities depending on the impedance presented by the user port, where q is an integer greater than or equal to 1, using the sensing unit output signals caused by an excitation applied to the user port, the signal processing unit delivering an "adjustment instruction" as a function of said q real quantities depending on the impedance presented by the user port; and a control unit (6), the control unit receiving the adjustment instruction from the signal processing unit (5), the control unit delivering "control signals", the control signals being determined as a function of the adjustment instruction, each of said parameters being mainly determined by at least one of the control signals.

Unfortunately, it was found that a tunable passive antenna often only provides a poor tuning capability, so that it is often not possible to obtain that the automatic antenna system shown in FIG. 1 can sufficiently reduce or cancel any variation in the impedance presented by the user port, caused by a variation in a frequency of operation, and/or caused by the well-known user interaction.

This problem is solved in a second example of a method for automatically adjusting a tunable passive antenna, applicable to a radio transmitter, which is implemented in the automatic antenna system shown in FIG. 2. This automatic antenna system is similar to the one disclosed in the ninth embodiment of the French patent application No. 14/00666 of 20 Mar. 2014 and of the PCT application No. PCT/IB2015/051644 of 6 Mar. 2015 (WO 2015/140660). The automatic antenna system shown in FIG. 2 has a user port (31), the user port presenting, at a given frequency, an impedance referred to as "the impedance presented by the user port", the automatic antenna system comprising:

a tunable passive antenna (1), the tunable passive antenna comprising at least one antenna control device, one or more characteristics of the tunable passive antenna being controlled by utilizing said at least one antenna control device, said at least one antenna control device having at least one parameter having an effect on said one or more characteristics, said at least one parameter being adjustable by electrical means;

a sensing unit (3) delivering two "sensing unit output signals", each of the sensing unit output signals being determined by one electrical variable sensed (or measured) at the user port;

a single-input-port and single-output-port tuning unit (4) having an input port and an output port, the input port being coupled to the user port through the sensing unit, the single-input-port and single-output-port tuning unit comprising p adjustable impedance devices, where p is an integer greater than or equal to one, the p adjustable impedance devices being referred to as "the one or more adjustable impedance devices of the tuning unit" and being such that, at said given frequency, each of the one or more adjustable impedance devices of the tuning unit has a reactance, the reactance of any one of the one or more adjustable impedance devices of the tuning unit being adjustable by electrical means;

a feeder (2) having a first end coupled to a signal port of the tunable passive antenna, the feeder having a second end coupled to the output port;

a signal processing unit (5), the signal processing unit estimating q real quantities depending on the impedance presented by the user port, where q is an integer greater than or equal to 1, using the sensing unit output signals caused by an excitation applied to the user port, the signal processing unit delivering an "adjustment instruction" as a function of said q real quantities depending on the impedance presented by the user port; and a control unit (6), the control unit receiving the adjustment instruction from the signal processing unit (5), the control unit delivering "control signals", the control signals being determined as a function of the adjustment instruction, the reactance of each of the one or more adjustable impedance devices of the tuning unit being mainly determined by at least one of the control signals, each of said parameters being mainly determined by at least one of the control signals.

This second example of a method for automatically adjusting a tunable passive antenna may provide an excellent tuning capability. Unfortunately, it can be shown that an adjustment of the single-input-port and single-output-port tuning unit obtained using this second example of a method for automatically adjusting a tunable passive antenna is typically not close to an optimal adjustment, when the losses in the single-input-port and single-output-port tuning unit are not very small.

Consequently, there is no known solution to the problem of automatically adjusting a tunable passive antenna coupled to a radio transmitter, in a manner that provides: a good tuning capability, by utilizing a single-input-port and single-output-port tuning unit; and an adjustment of the single-input-port and single-output-port tuning unit which is close to an optimal adjustment, when its losses are not very small.

SUMMARY OF THE INVENTION

The purpose of the invention is a method for automatically adjusting one or more tunable passive antennas and a single-input-port and single-output-port tuning unit, without the above-mentioned limitations of known techniques, and also an apparatus for radio communication using this method.

In what follows, X and Y being different quantities or variables, performing an action as a function of X does not preclude the possibility of performing this action as a function of Y. In what follows, "having an influence" and "having an effect" have the same meaning. In what follows, "coupled", when applied to two ports (in the meaning of circuit theory), may indicate that the ports are directly coupled, in which case each terminal of one of the ports is connected to (or, equivalently, in electrical contact with) one and only one of the terminals of the other port, and/or that the ports are indirectly coupled, in which case an electrical interaction different from direct coupling exists between the ports, for instance through one or more components.

The method of the invention is a method for automatically adjusting one or more tunable passive antennas and a single-input-port and single-output-port tuning unit, the single-input-port and single-output-port tuning unit having an input port and an output port, the one or more tunable passive antennas and the single-input-port and single-output-port tuning unit being parts of an apparatus for radio communication, the apparatus for radio communication allowing, at a given frequency, a transfer of power from the input port to an electromagnetic field radiated by the one or more tunable passive antennas, the method comprising the steps of:

applying an excitation to the input port;

estimating q real quantities depending on an impedance seen by the output port, where q is an integer greater than or equal to one, by utilizing said excitation;

generating one or more "antenna control signals", as a function of one or more of said q real quantities depending on an impedance seen by the output port, each of the one or more tunable passive antennas comprising at least one antenna control device, one or more characteristics of said each of the one or more tunable passive antennas being controlled by utilizing said at least one antenna control device, said at least one antenna control device having at least one parameter having an influence on said one or more characteristics, said at least one parameter being adjustable by electrical means, said at least one parameter being mainly determined by at least one of the one or more antenna control signals; and generating one or more "tuning control signals", as a function of one or more of said q real quantities depending on an impedance seen by the output port, the single-input-port and single-output-port tuning unit comprising p adjustable impedance devices, where p is an integer greater than or equal to one, the p adjustable impedance devices being referred to as "the one or more adjustable impedance devices of the tuning unit" and being such that, at the given frequency, each of the one or more adjustable impedance devices of the tuning unit has a reactance, the reactance of any one of the one or more adjustable impedance devices of the tuning unit being adjustable by electrical means, the reactance of any one of the one or more adjustable impedance devices of the tuning unit being mainly determined by at least one of the one or more tuning control signals.

The given frequency may for instance be a frequency greater than or equal to 150 kHz. The specialist understands that the impedance seen by the output port is a complex number, and that an impedance presented by the input port is a complex number. We will use $Z_{Sant}$ to denote the impedance seen by the output port, and $Z_U$ to denote the impedance presented by the input port.

Each of the one or more tunable passive antennas has a port, referred to as the "signal port" of the tunable passive antenna, which can be used to receive and/or to emit electromagnetic waves. Each of the one or more tunable passive antennas comprises at least one antenna control device, which may comprise one or more terminals used for other electrical connections. It is assumed that each of the one or more tunable passive antennas behaves, at the given frequency, with respect to its signal port, substantially as a passive antenna, that is to say as an antenna which is linear and does not use an amplifier for amplifying signals received by the antenna or signals emitted by the antenna. Let N be the number of the one or more tunable passive antennas. As a consequence of linearity, and considering only, for each of the one or more tunable passive antennas, its signal port, it is possible to define: if N is equal to one, an impedance presented by the one or more tunable passive antennas; and if N is greater than or equal to two, an impedance matrix presented by the one or more tunable passive antennas, this impedance matrix being of size N×N.

As said above in the prior art section, each of said one or more characteristics may for instance be an electrical characteristic such as an impedance at a specified frequency, or an electromagnetic characteristic such as a directivity pattern at a specified frequency.

It is said above that the apparatus for radio communication allows, at the given frequency, a transfer of power from the input port to an electromagnetic field radiated by the one or more tunable passive antennas. In other words, the apparatus for radio communication is such that, if a power is received by the input port at the given frequency, a part of said power received by the input port is transferred to an electromagnetic field radiated by the one or more tunable passive antennas at the given frequency, so that a power of the electromagnetic field radiated by the one or more tunable passive antennas at the given frequency is equal to said part of said power received by the input port. For instance, the specialist knows that a power of the electromagnetic field radiated by the one or more tunable passive antennas (average radiated power) can be computed as the flux of the real part of a complex Poynting vector of the electromagnetic field radiated by the one or more tunable passive antennas, through a closed surface containing the one or more tunable passive antennas.

To obtain that the apparatus for radio communication allows, at the given frequency, a transfer of power from the input port to an electromagnetic field radiated by the one or more tunable passive antennas, at least one of the one or more tunable passive antennas may for instance be coupled, directly or indirectly, to the output port. More precisely, for at least one of the one or more tunable passive antennas, the signal port of the tunable passive antenna may for instance be coupled, directly or indirectly, to the output port. For instance, an indirect coupling may be a coupling through a feeder and/or through a sensing unit and/or through a power combiner or a power divider. For suitable values of the one or more tuning control signals and of the one or more antenna control signals, said transfer of power from the input port to an electromagnetic field radiated by the one or more tunable passive antennas may for instance be a transfer of power with small or negligible or zero losses, this characteristic being preferred.

According to the invention, each of said q real quantities depending on an impedance seen by the output port may for instance be a real quantity representative of the impedance seen by the output port.

According to the invention, each of said q real quantities depending on an impedance seen by the output port may for instance be substantially proportional to the absolute value, or the phase, or the real part, or the imaginary part of the impedance seen by the output port, or of the inverse of the impedance seen by the output port (that is, the admittance seen by the output port), or of a voltage reflection coefficient at the output port.

The specialist sees a fundamental difference between the prior art method implemented in the automatic antenna system shown in FIG. 2, on the one part, and the invention, on the other part. In said prior art method, real quantities depending on the impedance presented by the user port are used for automatically adjusting the impedance presented by the user port. This means that said prior art method uses a closed-loop control scheme, in which the real quantities depending on the impedance presented by the user port are used to obtain control signals, which determine the reactance of each of the one or more adjustable impedance devices of the tuning unit, and therefore determine the impedance presented by the user port. In contrast, the method of the invention uses an open-loop control scheme to obtain the one or more tuning control signals, because one or more of the q real quantities depending on an impedance seen by the output port are used to obtain the one or more tuning control signals, the one or more tuning control signals having an influence on the reactance of each of the one or more adjustable impedance devices of the tuning unit, the one or more tuning control signals having no influence on the impedance seen by the output port.

The section II of the article of F. Broydé and E. Clavelier entitled "Some Properties of Multiple-Antenna-Port and Multiple-User-Port Antenna Tuners", published in *IEEE Trans. on Circuits and Systems—I: Regular Papers*, Vol. 62, No. 2, pp. 423-432, in February 2015, explains that there exists a mapping denoted by $f_U$ and defined by $$f_U(Z_{Sant}, X_1, \ldots, X_p) = Z_U \quad (1)$$

where, the one or more adjustable impedance devices of the tuning unit being numbered from 1 to p, for any integer j greater than or equal to 1 and less than or equal to p, we use $X_j$ to denote the reactance of the adjustable impedance device of the tuning unit numbered j, at the given frequency. Here, $Z_{Sant}$ is of course independent of the real variables $X_1, \ldots, X_p$, whereas the equation (1) shows that $Z_U$ depends on the real variables $X_1, \ldots, X_p$. This allows us to clarify said fundamental difference between said prior art method and the invention, in both of which each of the real variables $X_1, \ldots, X_p$ is mainly determined by at least one of the "control signals" or "tuning control signals". Said prior art method uses a closed-loop control scheme because it is such that real quantities depending on $Z_U$ are used to obtain control signals and consequently to determine the real variables $X_1, \ldots, X_p$, and thus to modify $Z_U$ according to equation (1). In contrast, the invention uses an open-loop control scheme to obtain the one or more tuning control signals, because real quantities depending on $Z_{Sant}$ are used to obtain the one or more tuning control signals and consequently to determine the real variables $X_1, \ldots, X_p$, which have no influence on $Z_{Sant}$. It is also possible to say that open-loop control is utilized to generate the one or more tuning control signals.

According to the invention, since real quantities depending on $Z_{Sant}$ are used to obtain the one or more tuning control signals and consequently to determine the real variables $X_1, \ldots, X_p$, the equation (1) indicates that the one or more tuning control signals can be used to control $Z_U$, if the mapping $f_U$ is known. More generally, the one or more tuning control signals can be used to control $Z_U$, using a suitable model of the single-input-port and single-output-port tuning unit. Thus, according to the invention, it is possible that the one or more tuning control signals are such that the impedance presented by the input port, computed using the equation (1), decreases or minimizes the absolute value of the image of the impedance presented by the input port under a function, the function being a complex function of a complex variable. For instance, if we define a wanted impedance, the wanted impedance being denoted by $Z_W$, said function may be denoted by g and defined by $$g(Z_U) = Z_U - Z_W \quad (2)$$

in which case the image of $Z_U$ under the function is a difference of impedances, or by $$g(Z_U) = Z_U^{-1} - Z_W^{-1} \quad (3)$$

in which case the image of $Z_U$ under the function is a difference of admittances, or by $$g(Z_U) = (Z_U - Z_W)(Z_U + Z_W)^{-1} \quad (4)$$

in which case the image of $Z_U$ under the function is a voltage reflection coefficient at the input port. We note that each of these functions is such that $g(Z_W)$ is zero.

The specialist understands that the one or more antenna control signals have an effect on each of said parameters, so that they may have an influence on the impedance seen by the output port, and on the impedance presented by the input port. In the previous sentence, "each of said parameters" clearly means "each said at least one parameter of each said at least one antenna control device of each of the one or more tunable passive antennas".

It was explained above that, in the method of the invention, open-loop control is utilized to generate the one or more tuning control signals. In contrast, the method of the invention may for instance be such that it utilizes closed-loop control to generate the one or more antenna control signals, because one or more of the q real quantities depending on an impedance seen by the output port are used to obtain the one or more antenna control signals, the one or more antenna control signals having an influence on each of said parameters, so that the one or more antenna control signals may have an influence on the impedance seen by the output port.

An apparatus implementing the method of the invention is an apparatus for radio communication comprising:
  one or more tunable passive antennas, each of the one or more tunable passive antennas comprising at least one antenna control device, one or more characteristics of said each of the one or more tunable passive antennas being controlled by utilizing said at least one antenna control device, said at least one antenna control device having at least one parameter having an influence on said one or more characteristics, said at least one parameter being adjustable by electrical means;
  a single-input-port and single-output-port tuning unit having an input port and an output port, the apparatus for radio communication allowing, at a given frequency, a transfer of power from the input port to an electromagnetic field radiated by the one or more tunable passive antennas, the single-input-port and single-output-port tuning unit comprising p adjustable impedance devices, where p is an integer greater than or equal to one, the p adjustable impedance devices being referred to as "the one or more adjustable impedance devices of the tuning unit" and being such that, at the given frequency, each of the one or more adjustable impedance devices of the tuning unit has a reactance, the reactance of any one of the one or more adjustable impedance devices of the tuning unit being adjustable by electrical means;
  a sensing unit delivering one or more "sensing unit output signals", each of the one or more sensing unit output signals being mainly determined by one or more electrical variables;
  a transmission and signal processing unit, the transmission and signal processing unit applying an excitation to the input port, the transmission and signal processing unit estimating q real quantities depending on an impedance seen by the output port, where q is an integer greater than or equal to one, by utilizing the one or more sensing unit output signals, the transmission and signal processing unit delivering one or more "antenna adjustment instructions", the one or more antenna adjustment instructions being determined as a function of one or more of said q real quantities depending on an impedance seen by the output port, the transmission and signal processing unit delivering one or more "tuning unit adjustment instructions", the one or more tuning unit adjustment instructions being determined as a function of one or more of said q real quantities depending on an impedance seen by the output port; and a control unit, the control unit delivering one or more "antenna control signals" to the one or more tunable passive antennas, each of the one or more antenna control signals being determined as a function of at least one of the one or more antenna adjustment instructions, each of said parameters being mainly determined by at least one of the one or more antenna control signals, the control unit delivering one or more "tuning control signals" to the single-input-port and single-output-port tuning unit, each of the one or more tuning control signals being determined as a function of at least one of the one or more tuning unit adjustment instructions, the reactance of each of the one or more adjustable impedance devices of the tuning unit being mainly determined by at least one of the one or more tuning control signals.

In the previous sentence, "each of said parameters" clearly means "each said at least one parameter of each said at least one antenna control device of each of the one or more tunable passive antennas".

For instance, each of said electrical variables may be a voltage, or an incident voltage, or a reflected voltage, or a current, or an incident current, or a reflected current. For instance, each of said electrical variables may be sensed (or measured) at the output port, or inside the single-input-port and single-output-port tuning unit.

It is for instance possible that the input port is coupled, directly or indirectly, to a port of the transmission and signal processing unit, said port of the transmission and signal processing unit delivering the excitation.

Said single-input-port and single-output-port tuning unit comprises an input port and an output port. It is assumed that said single-input-port and single-output-port tuning unit behaves, at said given frequency, with respect to its input port and output port, substantially as a passive linear device, where "passive" is used in the meaning of circuit theory. More precisely, said single-input-port and single-output-port tuning unit behaves, at said given frequency, with respect to the output port and the input port, substantially as a passive linear 2-port device. As a consequence of linearity, it is possible to define the impedance presented by the input port. As a consequence of passivity, the single-input-port and single-output-port tuning unit does not provide amplification.

The single-input-port and single-output-port tuning unit may for instance be such that the reactance of any one of the one or more adjustable impedance devices of the tuning unit has an influence on an impedance presented by the input port.

The specialist understands that the apparatus for radio communication of the invention is adaptive in the sense that each of said parameters and the reactances of the one or more adjustable impedance devices of the tuning unit can be automatically varied with time as a function of the one or more sensing unit output signals, which are each mainly determined by one or more electrical variables.

BRIEF DESCRIPTION OF THE DRAWINGS

Other advantages and characteristics will appear more clearly from the following description of particular embodiments of the invention, given by way of non-limiting examples, with reference to the accompanying drawings in which.

DETAILED DESCRIPTION OF SOME EMBODIMENTS

First Embodiment

Figure 1:
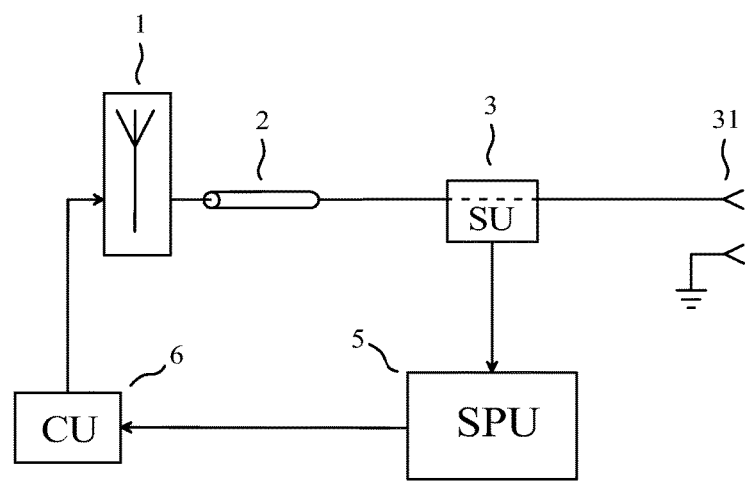
FIG. 1 shows a block diagram of an automatic antenna system, and has already been discussed in the section dedicated to the presentation of the prior art.
Figure 2:
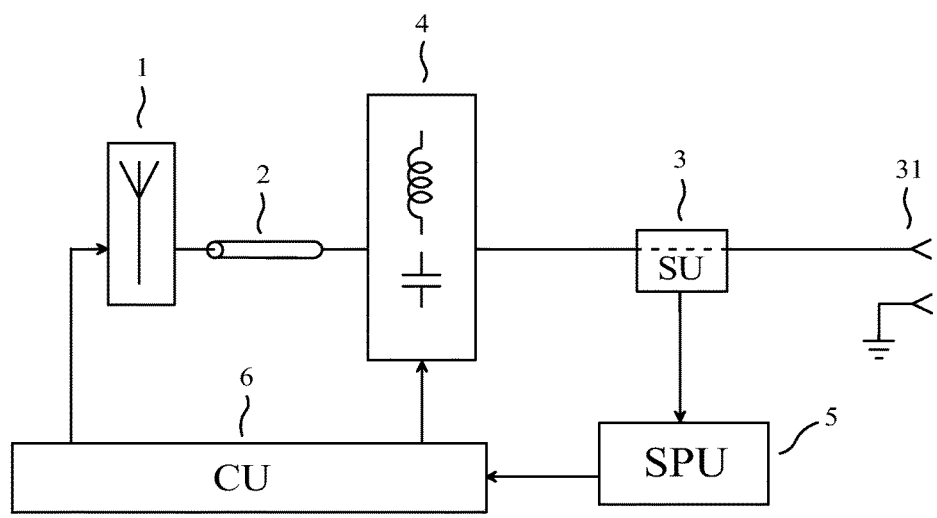
FIG. 2 shows a block diagram of an automatic antenna system, and has already been discussed in the section dedicated to the presentation of the prior art.
Figure 3:
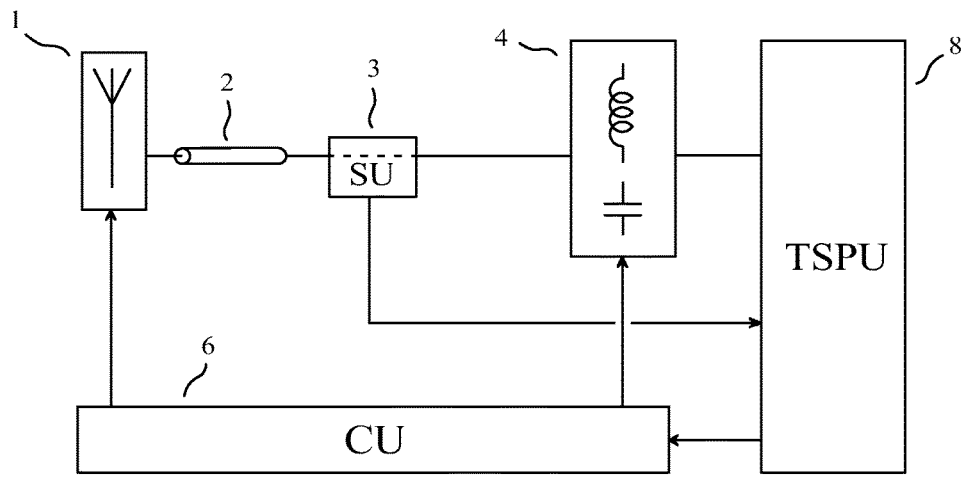
FIG. 3 shows a block diagram of an apparatus for radio communication of the invention (first embodiment)

As a first embodiment of a device of the invention, given by way of non-limiting example, we have represented in FIG. 3 the block diagram of an apparatus for radio communication comprising:

a tunable passive antenna (1), the tunable passive antenna comprising at least one antenna control device, one or more characteristics of said tunable passive antenna being controlled by utilizing said at least one antenna control device, said at least one antenna control device having at least one parameter having an influence on said one or more characteristics, said at least one parameter being adjustable by electrical means;

a single-input-port and single-output-port tuning unit (4) having an input port and an output port, the single-input-port and single-output-port tuning unit comprising p adjustable impedance devices, where p is an integer greater than or equal to two, the p adjustable impedance devices being referred to as "the one or more adjustable impedance devices of the tuning unit" and being such that, at a given frequency greater than or equal to 30 MHz, each of the one or more adjustable impedance devices of the tuning unit has a reactance, the reactance of any one of the one or more adjustable impedance devices of the tuning unit being adjustable by electrical means;

a sensing unit (3) delivering two "sensing unit output signals", each of the sensing unit output signals being determined by an electrical variable sensed (or measured) at the output port;

a feeder (2) having a first end which is directly coupled to a signal port of the tunable passive antenna, the feeder having a second end which is indirectly coupled to the output port, through the sensing unit;

a transmission and signal processing unit (8), the transmission and signal processing unit applying an excitation to the input port, the transmission and signal processing unit estimating q real quantities depending on an impedance seen by the output port, where q is an integer greater than or equal to two, by utilizing the sensing unit output signals, the transmission and signal processing unit delivering one or more "antenna adjustment instructions", the one or more antenna adjustment instructions being determined as a function of one or more of said q real quantities depending on an impedance seen by the output port, the transmission and signal processing unit delivering one or more "tuning unit adjustment instructions", the one or more tuning unit adjustment instructions being determined as a function of one or more of said q real quantities depending on an impedance seen by the output port; and a control unit (6), the control unit receiving the one or more antenna adjustment instructions, the control unit delivering one or more "antenna control signals" to the tunable passive antenna, each of the one or more antenna control signals being determined as a function of at least one of the one or more antenna adjustment instructions, each of said parameters being mainly determined by at least one of the one or more antenna control signals, the control unit receiving the one or more tuning unit adjustment instructions, the control unit delivering one or more "tuning control signals" to the single-input-port and single-output-port tuning unit, each of the one or more tuning control signals being determined as a function of at least one of the one or more tuning unit adjustment instructions, the reactance of each of the one or more adjustable impedance devices of the tuning unit being mainly determined by at least one of the one or more tuning control signals.

The tunable passive antenna is indirectly coupled to the output port. More precisely, the signal port of the tunable passive antenna is indirectly coupled to the output port, through the sensing unit and the feeder. Moreover, the output port is indirectly coupled to the tunable passive antenna. More precisely, the output port is indirectly coupled to the signal port of the tunable passive antenna, through the sensing unit and the feeder.

The sensing unit (3) may for instance be such that the sensing unit output signals comprise: a first sensing unit output signal proportional to a first electrical variable, the first electrical variable being a voltage across the output port; and a second sensing unit output signal proportional to a second electrical variable, the second electrical variable being a current flowing out of the output port. Said voltage across the output port may be a complex voltage and said current flowing out of the output port may be a complex current. Alternatively, the sensing unit (3) may for instance be such that the sensing unit output signals comprise: a first sensing unit output signal proportional to a first electrical variable, the first electrical variable being an incident voltage (which may also be referred to as "forward voltage") at the output port; and a second sensing unit output signal proportional to a second electrical variable, the second electrical variable being a reflected voltage at the output port. Said incident voltage at the output port may be a complex incident voltage and said reflected voltage at the output port may be a complex reflected voltage.

The input port is directly coupled to a port of the transmission and signal processing unit (8), said port of the transmission and signal processing unit delivering the excitation. Each of the one or more antenna adjustment instructions may be of any type of digital message. Each of the one or more tuning unit adjustment instructions may be of any type of digital message. The one or more antenna adjustment instructions and the one or more tuning unit adjustment instructions are delivered during one or more adjustment sequences. Two different adjustment sequences are described below, in the fourth embodiment and in the fifth embodiment. The duration of an adjustment sequence is less than 100 microseconds.

The single-input-port and single-output-port tuning unit (4) is such that it can provide, at said given frequency, for suitable values of the one or more tuning control signals, a low-loss transfer of power from the input port to the output port, and a low-loss transfer of power from the output port to the input port.

The output port being indirectly coupled to the tunable passive antenna, the specialist sees that the apparatus for radio communication allows, at the given frequency, a transfer of power from the input port to an electromagnetic field radiated by the tunable passive antenna. Thus, the apparatus for radio communication is such that, if a power is received by the input port at the given frequency, a part of said power received by the input port is transferred to an electromagnetic field radiated by the tunable passive antenna at the given frequency, so that a power of the electromagnetic field radiated by the tunable passive antenna at the given frequency is equal to said part of said power received by the input port. The apparatus for radio communication also allows, at the given frequency, a transfer of power from an electromagnetic field incident on the tunable passive antenna to the input port. Additionally, the single-input-port and single-output-port tuning unit (4) and the tunable passive antenna (1) are such that, at said given frequency, for suitable values of the one or more tuning control signals and of the one or more antenna control signals, a low-loss transfer of power from the input port to an electromagnetic field radiated by the tunable passive antenna can be obtained (for radio emission), and a low-loss transfer of power from an electromagnetic field incident on the tunable passive antenna to the input port can be obtained (for radio reception). Thus, it is possible to say that the apparatus for radio communication allows, at the given frequency, for suitable values of the one or more tuning control signals and of the one or more antenna control signals, a low-loss transfer of power from the input port to an electromagnetic field radiated by the tunable passive antenna, and a low-loss transfer of power from an electromagnetic field incident on the tunable passive antenna to the input port.

The suitable values of the one or more tuning control signals and of the one or more antenna control signals are provided automatically. Thus, the specialist understands that any small variation in the impedance seen by the output port can be at least partially compensated with a new automatic adjustment of the tunable passive antenna and of the one or more adjustable impedance devices of the tuning unit.

The apparatus for radio communication is a portable radio transceiver, so that the transmission and signal processing unit (8) also performs functions which have not been mentioned above, and which are well known to specialists. For instance, the apparatus for radio communication can be a user equipment (UE) of an LTE-advanced wireless network.

The specialist understands that $Z_{Sant}$ depends on the frequency and on the electromagnetic characteristics of the volume surrounding the tunable passive antenna. In particular, the body of the user has an effect on $Z_{Sant}$, and $Z_{Sant}$ depends on the position of the body of the user. This is referred to as "user interaction", or "hand effect" or "finger effect". The specialist understands that the apparatus for radio communication may automatically compensate a variation in $Z_{Sant}$ caused by a variation in a frequency of operation, and/or automatically compensate the user interaction.

In order to respond to variations in the electromagnetic characteristics of the volume surrounding the tunable passive antenna and/or in the frequency of operation, a new adjustment sequence starts shortly after each change of the frequency of operation, and no later than 10 milliseconds after the beginning of the previous adjustment sequence.

Second Embodiment

The second embodiment of a device of the invention, given by way of non-limiting example, also corresponds to the apparatus for radio communication shown in FIG. 3, and all explanations provided for the first embodiment are applicable to this second embodiment. Additionally, in this second embodiment, the excitation comprises a sinusoidal signal at said given frequency, for instance a sinusoidal current at said given frequency applied to the input port.

In this second embodiment, q=2 and the q real quantities depending on an impedance seen by the output port fully determine the impedance seen by the output port (that is to say: they are sufficient for allowing a computation of a real part of the impedance seen by the output port and of an imaginary part of this impedance). Also, the two sensing unit output signals are proportional to an incident voltage at the output port and to a reflected voltage at the output port, respectively, as explained above. The specialist understands how the transmission and signal processing unit can process the sensing unit output signals caused by the excitation, to obtain q real quantities depending on an impedance seen by the output port which fully determine the impedance seen by the output port. The transmission and signal processing unit may for instance perform an in-phase/quadrature (I/Q) demodulation (homodyne reception) of these sensing unit output signals, to obtain four analog signals. These analog signals may then be converted into digital signals and further processed in the digital domain, to estimate the real part of $Z_{Sant}$ and the imaginary part of $Z_{Sant}$. Thus, said q real quantities depending on an impedance seen by the output port may consist of a real number proportional to the real part of $Z_{Sant}$ and of a real number proportional to the imaginary part of $Z_{Sant}$. Alternatively, said q real quantities depending on an impedance seen by the output port may consist of a real number proportional to the absolute value of $Z_{Sant}$ and of a real number proportional to the argument of $Z_{Sant}$.

Third Embodiment

The third embodiment of a device of the invention, given by way of non-limiting example, also corresponds to the apparatus for radio communication shown in FIG. 3, and all explanations provided for the first embodiment are applicable to this third embodiment.

Additionally, in this third embodiment, the excitation is a bandpass signal. This type of signal is sometimes improperly referred to as "passband signal" or "narrow-band signal" (in French: "signal à bande étroite"). A bandpass signal is any real signal s(t), where t denotes the time, such that the spectrum of s(t) is included in a frequency interval $[f_C-W/2, f_C+W/2]$, where $f_C$ is a frequency referred to as "carrier frequency" and where W is a frequency referred to as "bandwidth", which satisfies $W<2f_C$. Thus, the Fourier transform of s(t), denoted by S(f), is non-negligible only in the frequency intervals $[-f_C-W/2, -f_C+W/2]$ and $[f_C-W/2, f_C+W/2]$. The complex envelope of the real signal s(t), also referred to as "complex baseband equivalent" or "baseband-equivalent signal", is a complex signal $s_B(t)$ whose Fourier transform $S_B(f)$ is non-negligible only in the frequency interval $[-W/2, W/2]$ and satisfies $S_B(f)=k\,S(f_C+f)$ in this interval, where k is a real constant which is chosen equal to the square root of 2 by some authors. The real part of $s_B(t)$ is referred to as the in-phase component, and the imaginary part of $s_B(t)$ is referred to as the quadrature component. The specialist knows that the bandpass signal s(t) may for instance be obtained:

as the result of a phase and amplitude modulation of a single carrier at the frequency $f_C$;

as a linear combination of a first signal and a second signal, the first signal being the product of the in-phase component and a first sinusoidal carrier of frequency $f_C$, the second signal being the product of the quadrature component and a second sinusoidal carrier of frequency $f_C$, the second sinusoidal carrier being 90° out of phase with respect to the first sinusoidal carrier;

in other ways, for instance without using any carrier, for instance using directly a filtered output of a digital-to-analog converter.

The frequency interval $[f_C-W/2, f_C+W/2]$ is a passband of the bandpass signal. From the definitions, it is clear that, for a given bandpass signal, several choices of carrier frequency $f_C$ and of bandwidth W are possible, so that the passband of the bandpass signal is not uniquely defined. However, any passband of the bandpass signal must contain any frequency at which the spectrum of s(t) is not negligible.

The complex envelope of the real signal s(t) clearly depends on the choice of a carrier frequency $f_C$. However, for a given carrier frequency, the complex envelope of the real signal s(t) is uniquely defined, for a given choice of the real constant k.

The excitation being a bandpass signal, it is possible to show that, if the bandwidth of the excitation is sufficiently narrow, then any voltage or current measured at the output port and caused by the excitation is a bandpass signal, a complex envelope of which is proportional to the complex envelope of the excitation, the coefficient of proportionality being complex and time-independent. Thus, we may consider that the excitation causes, at the output port: a current flowing out of the output port, of complex envelope $i_{TP}(t)$; and a voltage across the output port, of complex envelope $v_{TP}(t)$. If the bandwidth of the complex envelope of the excitation is sufficiently narrow, we have $$v_{TP}(t) = Z_{Sant} i_{TP}(t) \qquad (5)$$

where $Z_{Sant}$ is the impedance seen by the output port, at the carrier frequency.

The q real quantities depending on an impedance seen by the output port fully determine the impedance seen by the output port. Also, the two sensing unit output signals are proportional to a voltage across the output port and to a current flowing out of the output port, respectively, as explained above. The specialist understands how the transmission and signal processing unit can process the sensing unit output signals caused by the excitation and obtained while the excitation is being applied, to obtain q real quantities depending on an impedance seen by the output port which fully determine the impedance seen by the output port. According to a first example, the transmission and signal processing unit may perform a down-conversion of the sensing unit output signals, followed by an in-phase/quadrature (I/Q) demodulation (heterodyne reception), to obtain four analog signals, proportional to the real part of $v_{TP}(t)$, the imaginary part of $v_{TP}(t)$, the real part of $i_{TP}(t)$, and the imaginary part of $i_{TP}(t)$, respectively. These analog signals may then be converted into digital signals and further processed in the digital domain, based on equation (5), to estimate the absolute value of the admittance seen by the output port, and the phase of the admittance seen by the output port. According to a second example, the transmission and signal processing unit may perform a down-conversion of all sensing unit output signals, followed by a conversion into digital signals using bandpass sampling, and by a digital quadrature demodulation, to obtain four digital signals: the samples of the real part of $v_{TP}(t)$; the samples of the imaginary part of $v_{TP}(t)$; the samples of the real part of $i_{TP}(t)$; and the samples of the imaginary part of $i_{TP}(t)$. These digital signals may then be further processed, based on equation (5), to estimate the absolute value of the admittance seen by the output port, and the phase of the admittance seen by the output port.

Fourth Embodiment

Figure 4:
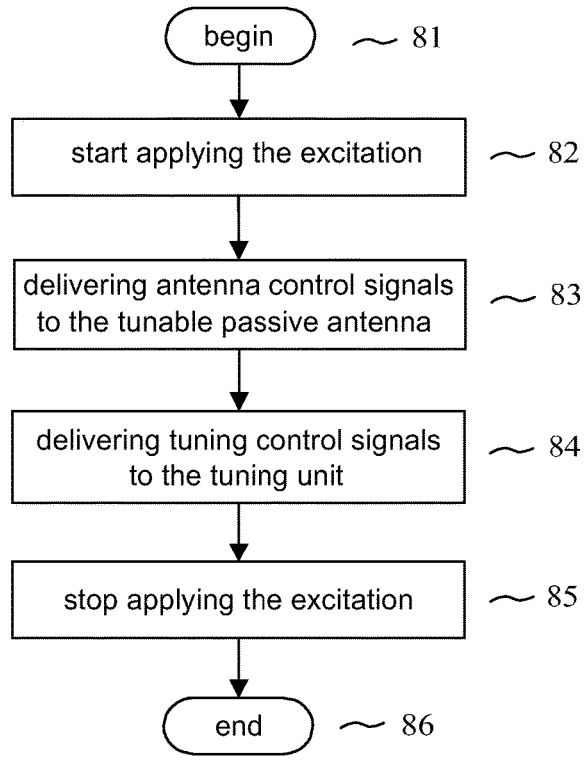
FIG. 4 shows a flowchart implemented in an apparatus for radio communication of the invention (fourth embodiment)

The fourth embodiment of a device of the invention, given by way of non-limiting example, also corresponds to the apparatus for radio communication shown in FIG. 3, and all explanations provided for the first embodiment are applicable to this fourth embodiment. A flowchart of one of the one or more adjustment sequences used in this fourth embodiment is shown in FIG. 4. Before the beginning of said one of the one or more adjustment sequences, a "selected frequency" has been defined by the transmission and signal processing unit. In addition to the begin symbol (81) and the end symbol (86), said flowchart comprises:

- a process "start applying the excitation" (82), in which the transmission and signal processing unit starts applying the excitation to the input port, so that the transmission and signal processing unit becomes able to estimate the q real quantities depending on an impedance seen by the output port, by utilizing the sensing unit output signals caused by the excitation (and obtained while the excitation is being applied), said excitation having a carrier frequency which is equal to the selected frequency;
- a process "delivering antenna control signals to the tunable passive antenna" (83), in which the transmission and signal processing unit delivers one or more of the one or more antenna adjustment instructions, and in which the control unit delivers said one or more antenna control signals to the tunable passive antenna;
- a process "delivering tuning control signals to the tuning unit" (84), in which the transmission and signal processing unit delivers one or more of the one or more tuning unit adjustment instructions, and in which the control unit delivers said one or more tuning control signals to the single-input-port and single-output-port tuning unit; and
- a process "stop applying the excitation" (85), in which the transmission and signal processing unit stops applying the excitation to the input port.

The tunable passive antenna is such that each said at least one parameter of each said at least one antenna control device of the tunable passive antenna has an effect on the impedance seen by the output port, denoted by $Z_{Sant}$. Since each of said parameters is mainly determined by at least one of the one or more antenna control signals, the one or more antenna control signals have an effect on $Z_{Sant}$. Thus, the process "delivering antenna control signals to the tunable passive antenna" (83) utilizes a closed-loop control scheme, because one or more of the q real quantities depending on an impedance seen by the output port are used to obtain the one or more antenna adjustment instructions, and afterwards the one or more antenna control signals. Thus, this fourth embodiment utilizes a closed-loop control scheme to generate the one or more antenna control signals.

In contrast, the process "delivering tuning control signals to the tuning unit" (84) uses an open-loop control scheme, since, as explained above, the invention uses an open-loop control scheme to obtain the one or more tuning control signals.

In this fourth embodiment, the one or more antenna adjustment instructions and the one or more antenna control signals are such that:

- at the end of the process "delivering antenna control signals to the tunable passive antenna" (83), the impedance seen by the output port approximates a specified impedance, which may depend on frequency;
- each said at least one parameter of each said at least one antenna control device of the tunable passive antenna has a value which does not change from the end of the process "delivering antenna control signals to the tunable passive antenna" (83) to the end (86) of said one of the one or more adjustment sequences.

To obtain that, at the end of the process "delivering antenna control signals to the tunable passive antenna" (83), the impedance seen by the output port approximates the specified impedance, the transmission and signal processing unit estimates the q real quantities depending on an impedance seen by the output port, and uses an algorithm to determine and deliver the one or more antenna adjustment instructions. The algorithm uses the q real quantities depending on an impedance seen by the output port. For instance, assuming that the q real quantities depending on an impedance seen by the output port fully determine the impedance seen by the output port (so that $Z_{Sant}$ may be computed), the algorithm may be an extremum-seeking control algorithm which seeks to minimize a performance variable by controlling the one or more antenna control signals, the performance variable being an absolute value of the difference between $Z_{Sant}$ and the specified impedance. For instance, the algorithm may use the selected frequency and the q real quantities depending on an impedance seen by the output port. For instance, assuming that the q real quantities depending on an impedance seen by the output port fully determine the impedance seen by the output port, the algorithm may be based on one or more formulas which can be used to estimate an optimal value of each said at least one parameter of each said at least one antenna control device of the tunable passive antenna, as a function of the selected frequency, of the one or more antenna adjustment instructions which were applicable while the sensing unit delivered the sensing unit output signals used to estimate the q real quantities depending on an impedance seen by the output port, and of $Z_{Sant}$. The specialist knows how to write such an algorithm. However, as said above in the prior art section, tunable passive antennas often only provide a poor tuning capability, so that, at the end of the process "delivering antenna control signals to the tunable passive antenna" (83), the impedance seen by the output port typically only coarsely approximates the specified impedance.

Figure 5:
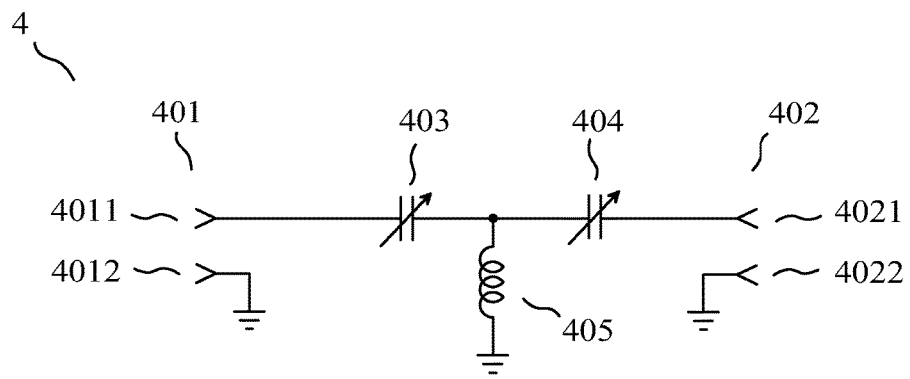
FIG. 5 shows a schematic diagram of a single-input-port and single-output-port tuning unit, which may be used in the apparatus for radio communication shown in FIG. 3 (fourth embodiment)

We have represented in FIG. 5 the single-input-port and single-output-port tuning unit (4) used in this fourth embodiment. This single-input-port and single-output-port tuning unit comprises:

- an output port (401) having two terminals (4011) (4012), the output port being single-ended;
- an input port (402) having two terminals (4021) (4022), the input port being single-ended;
- one of the one or more adjustable impedance devices of the tuning unit (403), presenting a negative reactance and having a terminal connected to a terminal of the output port;
- one of the one or more adjustable impedance devices of the tuning unit (404), presenting a negative reactance and having a terminal connected to a terminal of the input port; and
- a winding (405), having a first terminal coupled to ground, and having a second terminal coupled to a terminal of each of the one or more adjustable impedance devices of the tuning unit (403) (404).

Each of the one or more adjustable impedance devices of the tuning unit (403) (404) is adjustable by electrical means, but the circuits and the control links needed to determine the reactance of each of the one or more adjustable impedance devices of the tuning unit are not shown in FIG. 5.

The specialist understands that the single-input-port and single-output-port tuning unit is such that, at said given frequency, if the impedance seen by the output port is equal to a given impedance, then the reactance of any one of the one or more adjustable impedance devices of the tuning unit has an influence on an impedance presented by the input port. Moreover, the single-input-port and single-output-port tuning unit has a full tuning capability, the definition of which is given in section III of said article entitled "Some Properties of Multiple-Antenna-Port and Multiple-User-Port Antenna Tuners". Thus, the specialist understands that any small variation in the impedance seen by the output port can be completely compensated with a new automatic adjustment of the one or more adjustable impedance devices of the tuning unit; and that the single-input-port and single-output-port tuning unit can be such that it can provide, at said given frequency, for suitable values of the one or more tuning control signals, a low-loss transfer of power from the input port to the output port, and a low-loss transfer of power from the output port to the input port.

In this fourth embodiment, we use p=2 adjustable impedance devices of the tuning unit. Thus, it is possible that p is greater than or equal to 2. As explained in said article entitled "Some Properties of Multiple-Antenna-Port and Multiple-User-Port Antenna Tuners", this is necessary to obtain a full tuning capability.

At the beginning of the process "delivering tuning control signals to the tuning unit" (84), the transmission and signal processing unit again estimates the q real quantities depending on an impedance seen by the output port, to obtain new values of the q real quantities depending on an impedance seen by the output port, said new values being representative of an impedance seen by the output port immediately after the end of the process "delivering antenna control signals to the tunable passive antenna" (83). The process "delivering tuning control signals to the tuning unit" (84) uses a lookup table (also spelled "look-up table") to determine the one or more tuning unit adjustment instructions, as a function of the selected frequency and of the q real quantities depending on an impedance seen by the output port (more precisely, of said new values of the q real quantities depending on an impedance seen by the output port). The specialist understands how to build and use such a lookup table. Here, the adaptive process carried out by the transmission and signal processing unit requires neither complex computations nor any iteration, because the lookup table directly uses the selected frequency and the q real quantities depending on an impedance seen by the output port to determine the one or more tuning unit adjustment instructions (so that there is a direct relationship between the real quantities depending on an impedance seen by the output port and the reactance value that each of the one or more adjustable impedance devices of the tuning unit should take on after being adjusted). The lookup table is built as from experimental results and is such that the adjustment of the single-input-port and single-output-port tuning unit is always optimal or almost optimal, in spite of the losses in the single-input-port and single-output-port tuning unit.

Consequently, this embodiment is a solution to the problem of automatically adjusting a tunable passive antenna coupled to a radio transmitter, in a manner that provides: a good tuning capability, by utilizing a single-input-port and single-output-port tuning unit; and an adjustment of the single-input-port and single-output-port tuning unit which is close to an optimal adjustment, when its losses are not very small. Moreover, this embodiment provides a much broader tuning range than an automatic tuning system which would comprise the single-input-port and single-output-port tuning unit shown in FIG. 5, but no tunable passive antenna.

Fifth Embodiment (Best Mode)

Figure 6:
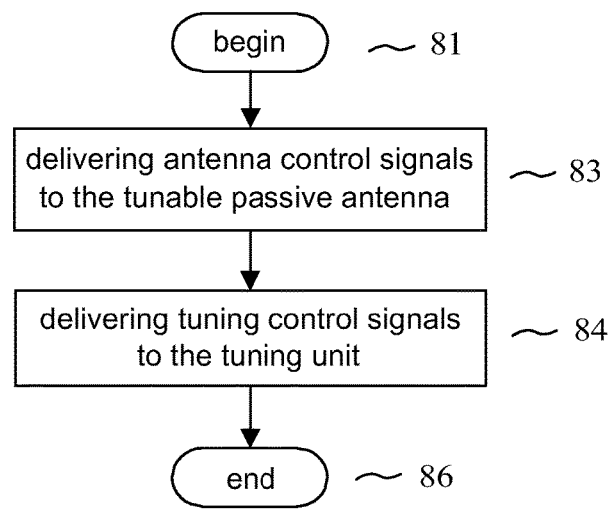
FIG. 6 shows a flowchart implemented in an apparatus for radio communication of the invention (fifth embodiment)

The fifth embodiment of a device of the invention, given by way of non-limiting example and best mode of carrying out the invention, also corresponds to the apparatus for radio communication shown in FIG. 3, and all explanations provided for the first embodiment are applicable to this fifth embodiment. In this fifth embodiment, the excitation is applied continuously, so that the sensing unit can continuously deliver the sensing unit output signals caused by said excitation. A flowchart of one of the one or more adjustment sequences used in this fifth embodiment is shown in FIG. 6. Before the beginning of said one of the one or more adjustment sequences, a "selected frequency" has been defined by the transmission and signal processing unit. Said excitation has, during said one of the one or more adjustment sequences, a carrier frequency which is equal to the selected frequency. In addition to the begin symbol (81) and the end symbol (86), said flowchart comprises:

a process "delivering antenna control signals to the tunable passive antenna" (83), in which the transmission and signal processing unit delivers one or more of the one or more antenna adjustment instructions, and in which the control unit delivers said one or more antenna control signals to the tunable passive antenna; and a process "delivering tuning control signals to the tuning unit" (84), in which the transmission and signal processing unit delivers one or more of the one or more tuning unit adjustment instructions, and in which the control unit delivers said one or more tuning control signals to the single-input-port and single-output-port tuning unit.

In this fifth embodiment, the one or more antenna adjustment instructions and the one or more antenna control signals are such that:

at the end of the process "delivering antenna control signals to the tunable passive antenna" (83), the impedance seen by the output port approximates a specified impedance, which may depend on frequency;

each said at least one parameter of each said at least one antenna control device of the tunable passive antenna has a value which does not change from the end of the process "delivering antenna control signals to the tunable passive antenna" (83) to the beginning of an adjustment sequence which follows the end of said one of the one or more adjustment sequences.

To obtain that, at the end of the process "delivering antenna control signals to the tunable passive antenna" (83), the impedance seen by the output port approximates the specified impedance, the transmission and signal processing unit estimates the q real quantities depending on an impedance seen by the output port, and uses a lookup table to determine and deliver the one or more antenna adjustment instructions, as a function of the selected frequency and of the q real quantities depending on an impedance seen by the output port, and as a function of the one or more antenna adjustment instructions which were applicable while the sensing unit delivered the sensing unit output signals used to estimate the q real quantities depending on an impedance seen by the output port. The specialist understands how to build and use such a lookup table. The lookup table is such that the adjustment of the tunable passive antenna is optimal or nearly optimal. However, as said above in the prior art section, tunable passive antennas often only provide a poor tuning capability. Consequently, at the end of the process "delivering antenna control signals to the tunable passive antenna" (83), the impedance seen by the output port typically only very coarsely approximates the specified impedance.

Figure 7:
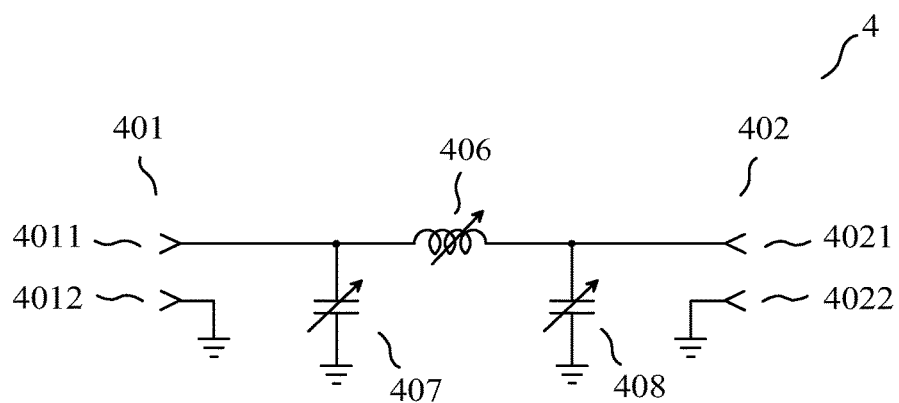
FIG. 7 shows a schematic diagram of a single-input-port and single-output-port tuning unit, which may be used in the apparatus for radio communication shown in FIG. 3 (fifth embodiment)

We have represented in FIG. 7 the single-input-port and single-output-port tuning unit (4) used in this fifth embodiment. This single-input-port and single-output-port tuning unit comprises:

an output port (401) having two terminals (4011) (4012), the output port being single-ended;

an input port (402) having two terminals (4021) (4022), the input port being single-ended;

one of the one or more adjustable impedance devices of the tuning unit (406), presenting a positive reactance, having a first terminal connected to a terminal of the input port, and having a second terminal connected to a terminal of the output port;

one of the one or more adjustable impedance devices of the tuning unit (407), presenting a negative reactance and connected in parallel with the output port; and one of the one or more adjustable impedance devices of the tuning unit (408), presenting a negative reactance and connected in parallel with the input port.

Each of the one or more adjustable impedance devices of the tuning unit (406) (407) (408) is adjustable by electrical means, but the circuits and the control links needed to determine the reactance of each of the one or more adjustable impedance devices of the tuning unit are not shown in FIG. 7. In this fifth embodiment, we use p=3 adjustable impedance devices of the tuning unit.

The specialist understands that, at a frequency at which the single-input-port and single-output-port tuning unit is intended to operate, the single-input-port and single-output-port tuning unit is such that, if the impedance seen by the output port is equal to a given impedance, then the reactance of any one of the one or more adjustable impedance devices of the tuning unit has an effect on an impedance presented by the input port.

At the beginning of the process "delivering tuning control signals to the tuning unit" (84), the transmission and signal processing unit again estimates the q real quantities depending on an impedance seen by the output port, to obtain new values of the q real quantities depending on an impedance seen by the output port, said new values being representative of an impedance seen by the output port immediately after the end of the process "delivering antenna control signals to the tunable passive antenna" (83). The process "delivering tuning control signals to the tuning unit" (84) uses an algorithm to determine the one or more tuning unit adjustment instructions. The algorithm uses the selected frequency and the q real quantities depending on an impedance seen by the output port (more precisely, said new values of the q real quantities depending on an impedance seen by the output port). A first possible algorithm may for instance use the formulas shown in Section VI of said article entitled "Some Properties of Multiple-Antenna-Port and Multiple-User-Port Antenna Tuners". This first possible algorithm does not take the losses of the single-input-port and single-output-port tuning unit into account. A second possible algorithm may for instance use the iterative computation technique presented in Section 4 or in Appendix C of the article of F. Broydé and E. Clavelier entitled "A Tuning Computation Technique for a Multiple-Antenna-Port and Multiple-User-Port Antenna Tuner", published in *International Journal of Antennas and Propagation*, in 2016. This second possible algorithm is more accurate than the first possible algorithm, because it takes the losses in the single-input-port and single-output-port tuning unit into account. The specialist knows how to write such an algorithm. We see that the algorithm can be such that the adjustment of the single-input-port and single-output-port tuning unit is always optimal or almost optimal, in spite of the losses in the single-input-port and single-output-port tuning unit.

Consequently, this embodiment is a solution to the problem of automatically adjusting a tunable passive antenna coupled to a radio transmitter, in a manner that provides: a good tuning capability, by utilizing a single-input-port and single-output-port tuning unit; and an adjustment of the single-input-port and single-output-port tuning unit which is close to an optimal adjustment, when its losses are not very small. Moreover, this embodiment provides a much broader tuning range than an automatic tuning system which would comprise the single-input-port and single-output-port tuning unit shown in FIG. 7, but no tunable passive antenna.

Sixth Embodiment

The sixth embodiment of a device of the invention, given by way of non-limiting example, also corresponds to the apparatus for radio communication shown in FIG. 3, and all explanations provided for the first embodiment are applicable to this sixth embodiment.

Figure 8:
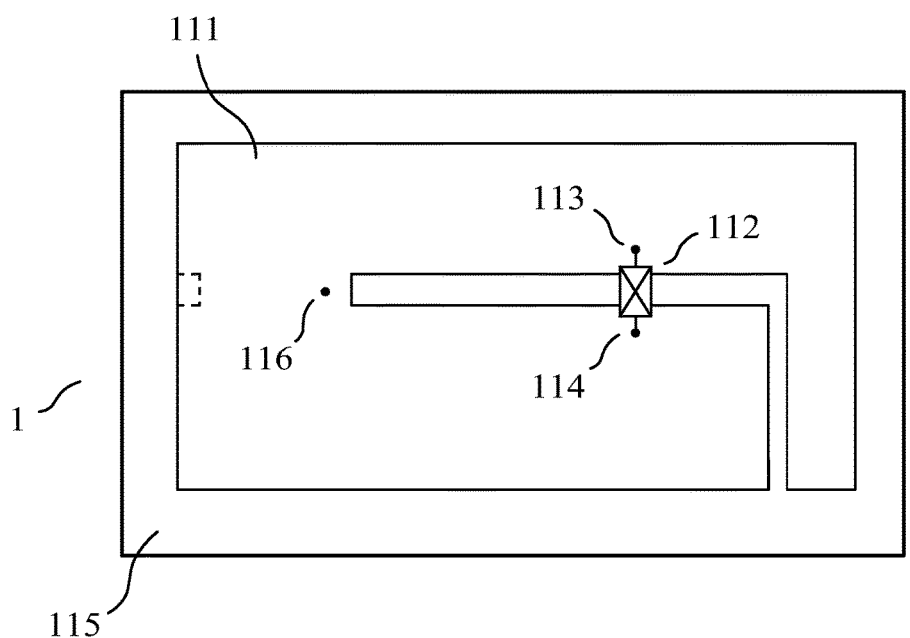
FIG. 8 shows a first tunable passive antenna, which comprises a single antenna control device (sixth embodiment)

The tunable passive antenna (1) used in this sixth embodiment is shown in FIG. 8. The tunable passive antenna shown in FIG. 8 comprises a planar metallic structure (111) built above a ground plane (115), the signal port of the tunable passive antenna (116) where an unbalanced feeder is connected to the metallic structure, and an antenna control device (112). The metallic structure is slotted and such that, if the antenna control device was not present, the tunable passive antenna would be an example of a planar inverted-F antenna, also referred to as PIFA. The antenna control device is a MEMS switch comprising a first terminal (113) connected to the metallic structure (111) at a first side of the slot, and a second terminal (114) connected to the metallic structure (111) at a second side of the slot. The specialist understands that the self-impedance of the tunable passive antenna, in a given test configuration and at the given frequency, is a characteristic of the tunable passive antenna which may be varied using said antenna control device, so that this characteristic is controlled by utilizing said antenna control device. The state of the MEMS switch (on or off) is a parameter of the antenna control device which has an influence on said characteristic. This parameter of the antenna control device is adjustable by electrical means, but the circuits and the control links needed to determine the state of the antenna control device are not shown in FIG. 8.

Seventh Embodiment

The seventh embodiment of an apparatus of the invention, given by way of non-limiting example, also corresponds to the apparatus for radio communication shown in FIG. 3, and all explanations provided for the first embodiment are applicable to this seventh embodiment.

Figure 9:
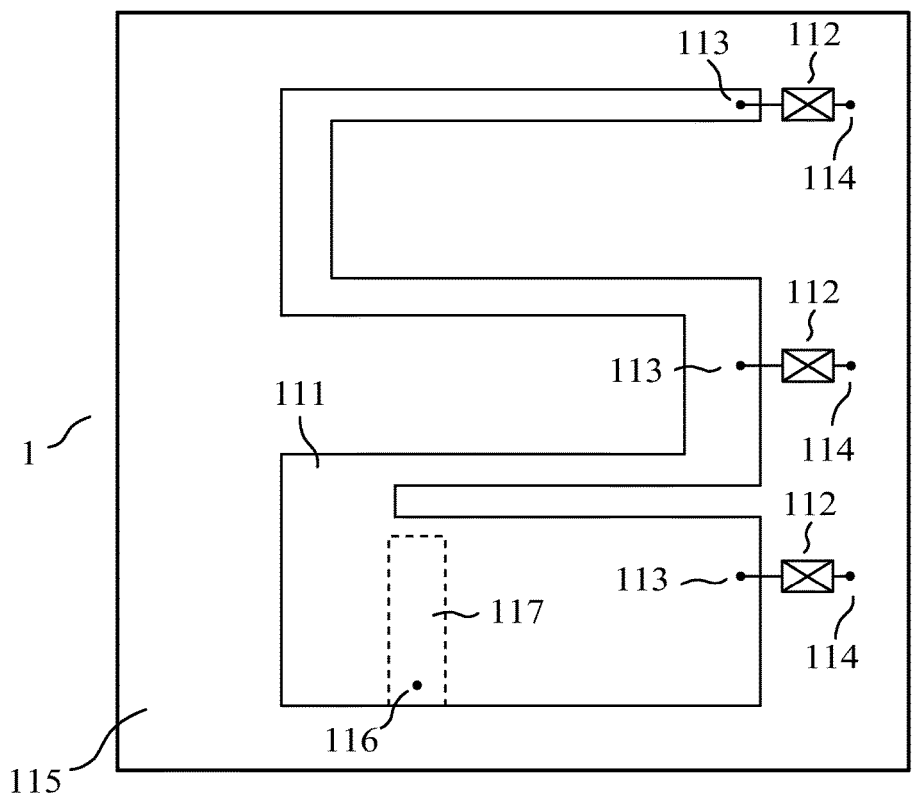
FIG. 9 shows a second tunable passive antenna, which comprises three antenna control devices (seventh embodiment)

The tunable passive antenna (1) used in this seventh embodiment is shown in FIG. 9. The tunable passive antenna shown in FIG. 9 comprises a planar metallic structure (111) built above a ground plane (115), the signal port of the tunable passive antenna (116) where an unbalanced feeder is connected to a metallic strip (117) lying between the ground plane and the metallic structure, and three antenna control devices (112). Each of the antenna control devices is an adjustable impedance device having a reactance at the given frequency, comprising a first terminal (113) connected to the metallic structure (111), and a second terminal (114) connected to the ground plane (115). The specialist understands that the self-impedance of the tunable passive antenna, in a given test configuration and at the given frequency, is a characteristic of the tunable passive antenna which may be varied using said antenna control devices, so that this characteristic is controlled by utilizing said antenna control devices. Each of the antenna control devices has a reactance at the given frequency, this reactance being a parameter of said each of the antenna control devices, this parameter having an influence on said characteristic. This parameter of each of the antenna control devices is adjustable by electrical means, but the circuits and the control links needed to determine the reactance of each of the antenna control devices are not shown in FIG. 9.

Eighth Embodiment

The eighth embodiment of an apparatus of the invention, given by way of non-limiting example, also corresponds to the apparatus for radio communication shown in FIG. 3, and all explanations provided for the first embodiment are applicable to this eighth embodiment.

Figure 10:
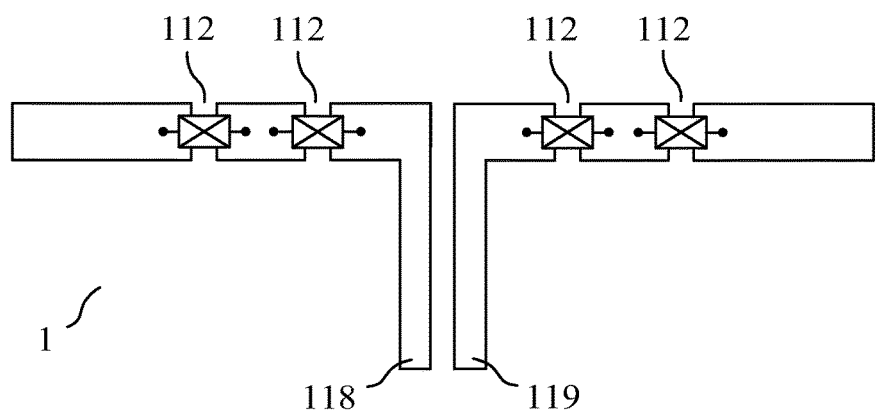
FIG. 10 shows a third tunable passive antenna, which comprises four antenna control devices (eighth embodiment)

The tunable passive antenna (1) used in this eighth embodiment is shown in FIG. 10. The tunable passive antenna shown in FIG. 10 has a plane of symmetry orthogonal to the drawing. Thus, the tunable passive antenna has a first half-antenna, on the left in FIG. 10, and a second half-antenna, on the right in FIG. 10. The signal port of the tunable passive antenna comprises a first terminal (118) where a first conductor of a balanced feeder is connected to the first half-antenna, and a second terminal (119) where a second conductor of the balanced feeder is connected to the second half-antenna. Each half-antenna includes three segments and two antenna control devices (112). Each of the antenna control devices is an adjustable impedance device having a reactance at the given frequency, comprising a first terminal connected to a segment of an half-antenna, and a second terminal connected to another segment of this half-antenna. The specialist understands that the self-impedance of the tunable passive antenna, in a given test configuration and at the given frequency, is a characteristic of the tunable passive antenna which may be varied using said antenna control devices, so that this characteristic is controlled by utilizing said antenna control devices. Each of the antenna control devices has a reactance at the given frequency, this reactance being a parameter of said each of the antenna control devices, this parameter having an influence on said characteristic. This parameter of each of the antenna control devices is adjustable by electrical means, but the circuits and the control links needed to determine the reactance of each of the antenna control devices are not shown in FIG. 10.

Ninth Embodiment

The ninth embodiment of an apparatus of the invention, given by way of non-limiting example, also corresponds to the apparatus for radio communication shown in FIG. 3, and all explanations provided for the first embodiment are applicable to this ninth embodiment.

Figure 11:
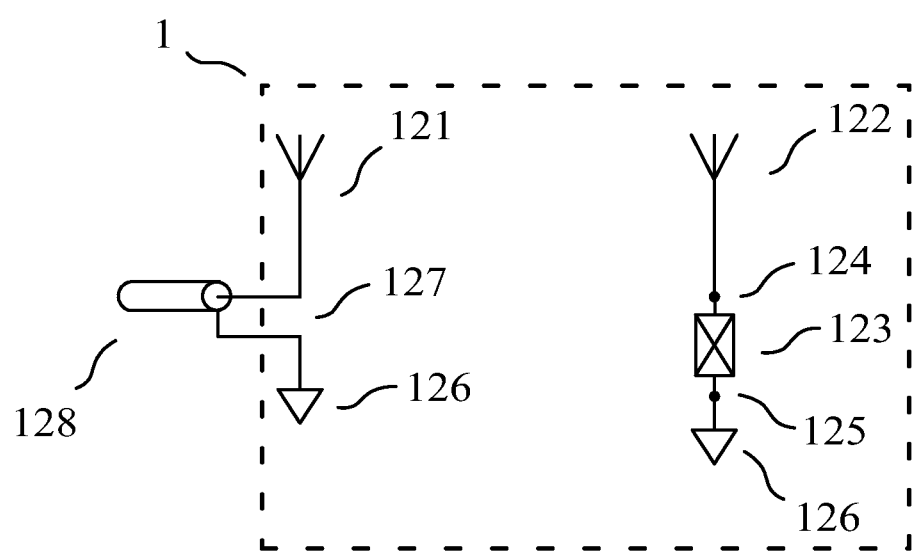
FIG. 11 shows a fourth tunable passive antenna, which comprises a single antenna control device (ninth embodiment)

The tunable passive antenna (1) used in this ninth embodiment is shown in FIG. 11. The tunable passive antenna shown in FIG. 11 comprises a main antenna (121), a parasitic antenna (122), the signal port of the tunable passive antenna (127) where an unbalanced feeder (128) is connected to the main antenna and to ground (126), and an antenna control device (123). The antenna control device is an adjustable impedance device having a reactance at the given frequency, comprising a first terminal (124) connected to the parasitic antenna (122), and a second terminal (125) connected to ground (126). The specialist understands that the directivity pattern of the tunable passive antenna, in a given test configuration and at the given frequency, is a characteristic of the tunable passive antenna which may be varied using said antenna control device, so that this characteristic is controlled by utilizing said antenna control device. The reactance of the antenna control device at the given frequency is a parameter of said antenna control device which has an influence on said characteristic. This parameter of the antenna control device is adjustable by electrical means, but the circuits and the control links needed to determine the reactance of the antenna control device are not shown in FIG. 11.

However, the specialist understands that this parameter also has an influence on the self-impedance of the tunable passive antenna, so that the self-impedance of the tunable passive antenna, in a given test configuration and at the given frequency, is also a characteristic of the tunable passive antenna which may be varied using said antenna control device. The tunable passive antenna (1) could also comprise other parasitic antennas each coupled to an antenna control device.

Tenth Embodiment

Figure 12:
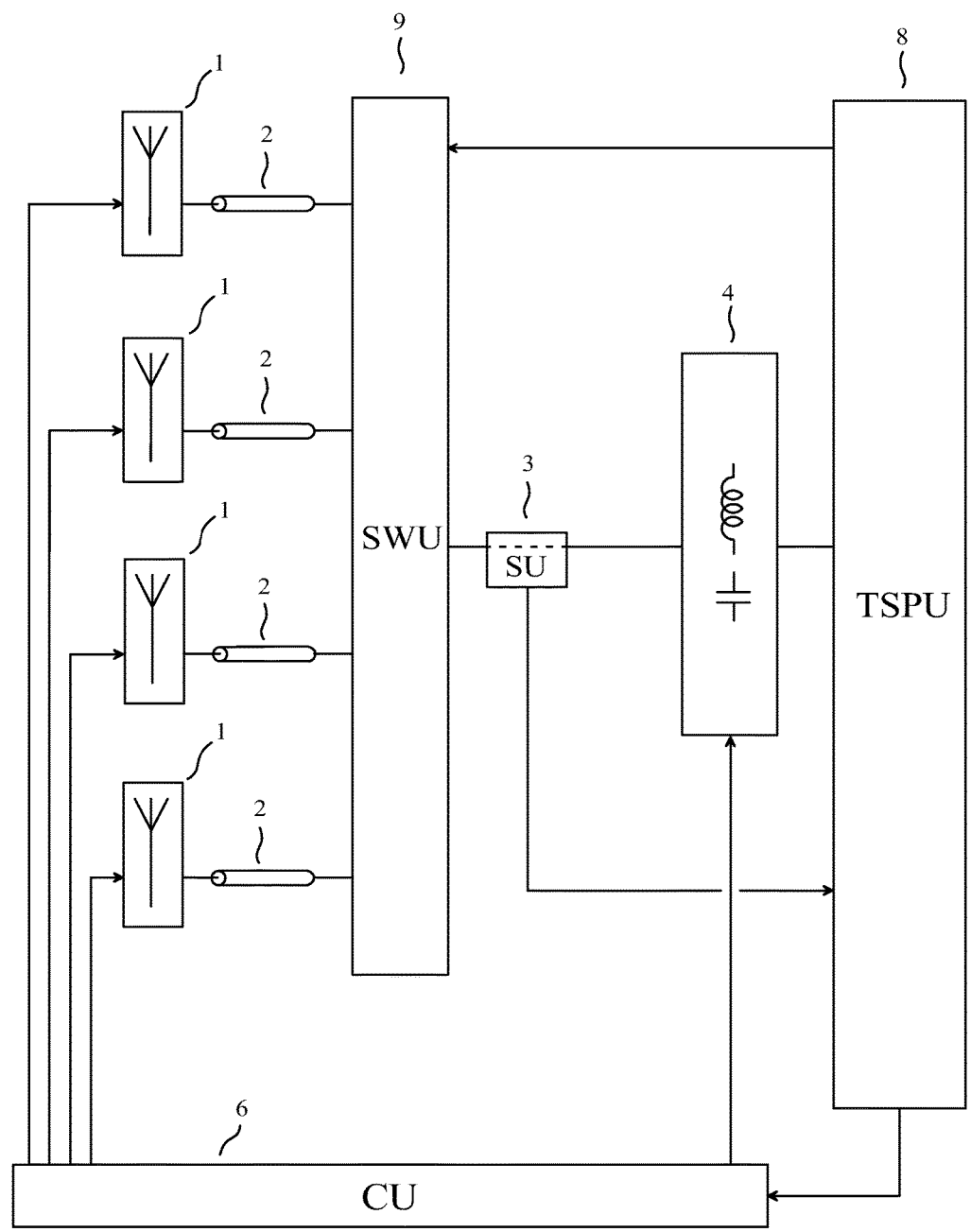
FIG. 12 shows a block diagram of an apparatus for radio communication of the invention (tenth embodiment)

As a tenth embodiment of a device of the invention, given by way of non-limiting example, we have represented in FIG. 12 the block diagram of an apparatus for radio communication comprising:

- N=4 tunable passive antennas (1), each of the tunable passive antennas comprising at least one antenna control device, said at least one antenna control device having at least one parameter having an effect on one or more characteristics of said each of the tunable passive antennas, said at least one parameter being adjustable by electrical means;
- a switching unit (9), the switching unit comprising N antenna ports each coupled to one and only one of the tunable passive antennas through a feeder (2), the switching unit comprising an antenna array port, the switching unit operating in an active configuration determined by one or more "configuration instructions", the active configuration being one of a plurality of allowed configurations, the switching unit providing, in any one of the allowed configurations, for signals in a given frequency band, a bidirectional path between the antenna array port and one and only one of the antenna ports;
- a single-input-port and single-output-port tuning unit (4) having an input port and an output port, the single-input-port and single-output-port tuning unit comprising p adjustable impedance devices, where p is an integer greater than or equal to one, the p adjustable impedance devices being referred to as "the one or more adjustable impedance devices of the tuning unit" and being such that, at a given frequency in the given frequency band, each of the one or more adjustable impedance devices of the tuning unit has a reactance, the reactance of any one of the one or more adjustable impedance devices of the tuning unit being adjustable by electrical means;
- a sensing unit (3) delivering one or more "sensing unit output signals", each of the one or more sensing unit output signals being mainly determined by one or more electrical variables sensed (or measured) at the output port, the output port being indirectly coupled to the antenna array port through the sensing unit;
- a transmission and signal processing unit (8), the transmission and signal processing unit delivering the one or more configuration instructions, the transmission and signal processing unit applying an excitation to the input port, the transmission and signal processing unit estimating q real quantities depending on an impedance seen by the output port, where q is an integer greater than or equal to one, by utilizing the one or more sensing unit output signals caused by the excitation, the transmission and signal processing unit delivering one or more "antenna adjustment instructions", the one or more antenna adjustment instructions being determined as a function of one or more of said q real quantities depending on an impedance seen by the output port, the transmission and signal processing unit delivering one or more "tuning unit adjustment instructions", the one or more tuning unit adjustment instructions being determined as a function of one or more of said q real quantities depending on an impedance seen by the output port; and
- a control unit (6), the control unit delivering one or more "antenna control signals" to the tunable passive antennas, each of the one or more antenna control signals being determined as a function of at least one of the one or more antenna adjustment instructions, each said at least one parameter of each said at least one antenna control device of each of the tunable passive antennas being determined by at least one of the one or more antenna control signals, the control unit delivering one or more "tuning control signals" to the single-input-port and single-output-port tuning unit, each of the one or more tuning control signals being determined as a function of at least one of the one or more tuning unit adjustment instructions, the reactance of each of the one or more adjustable impedance devices of the tuning unit being determined by at least one of the one or more tuning control signals.

In the previous sentence, we note that: the requirement "the one or more antenna adjustment instructions being determined as a function of one or more of said q real quantities depending on an impedance seen by the output port" does not mean that each of the one or more antenna adjustment instructions is determined as a function of one or more of said q real quantities depending on an impedance seen by the output port; and the requirement "the one or more tuning unit adjustment instructions being determined as a function of one or more of said q real quantities depending on an impedance seen by the output port" does not mean that each of the one or more tuning unit adjustment instructions is determined as a function of one or more of said q real quantities depending on an impedance seen by the output port.

The switching unit operates (or is used) in an active configuration determined by the one or more configuration instructions, the active configuration being one of a plurality of allowed configurations, the switching unit providing, in any one of the allowed configurations, for signals in the given frequency band, a path between the antenna array port and one of the antenna ports. Thus, the switching unit operates in an active configuration which is one of the allowed configurations, and each allowed configuration corresponds to a selection of an antenna port among the N antenna ports. It is also possible to say that the switching unit operates in an active configuration corresponding to a selection of an antenna port among the N antenna ports.

Each allowed configuration corresponds to a selection of an antenna port among the N antenna ports, the switching unit providing, for signals in the given frequency band, a path between the antenna array port and the selected antenna port. This path may preferably be a low loss path for signals in the given frequency band. The specialist understands that a suitable switching unit may comprise one or more electrically controlled switches and/or change-over switches. In this case, one or more of said one or more electrically controlled switches and/or change-over switches may for instance be an electro-mechanical relay, or a microelectromechanical switch, or a circuit using one or more PIN diodes and/or one or more insulated-gate field-effect transistors as switching devices.

In this tenth embodiment, it is not possible to say that, for each of the tunable passive antennas, a signal port of the tunable passive antenna is coupled, directly or indirectly, to the output port. However, in this tenth embodiment, the output port is, at a given time, coupled to one and only one of the N tunable passive antennas. Or, more precisely, the output port is, at any given time except during a change of active configuration, indirectly coupled to a signal port of one and only one of the N tunable passive antennas, through the sensing unit, the switching unit, and one and only one of the feeders.

The output port being indirectly coupled to the antenna array port through the sensing unit, the specialist sees that the apparatus for radio communication allows, at the given frequency, a transfer of power from the input port to an electromagnetic field radiated by the tunable passive antennas. Thus, the apparatus for radio communication is such that, if a power is received by the input port at the given frequency, a part of said power received by the input port is transferred to an electromagnetic field radiated by the tunable passive antennas at the given frequency, so that a power of the electromagnetic field radiated by the tunable passive antennas at the given frequency is equal to said part of said power received by the input port. The apparatus for radio communication also allows, at the given frequency, a transfer of power from an electromagnetic field incident on the tunable passive antennas to the input port. Additionally, the single-input-port and single-output-port tuning unit (4) and the tunable passive antennas (1) are such that, at said given frequency, for suitable values of the one or more tuning control signals and of the one or more antenna control signals, a low-loss transfer of power from the input port to an electromagnetic field radiated by the tunable passive antennas can be obtained (for radio emission), and a low-loss transfer of power from an electromagnetic field incident on the tunable passive antennas to the input port can be obtained (for radio reception).

The apparatus for radio communication is such that closed-loop control is utilized to determine each of the one or more antenna adjustment instructions, and closed-loop control is utilized to generate each of the one or more antenna control signals.

The apparatus for radio communication is a radio transmitter or a radio transceiver, so that the transmission and signal processing unit (8) also performs functions which have not been mentioned above, and which are well known to specialists. The given frequency band only contains frequencies greater than or equal to 300 MHz.

For instance, each of the one or more configuration instructions may be determined as a function of:
one or more localization variables, each of the one or more localization variables depending on a distance between a part of a human body and a zone of the apparatus for radio communication;
a frequency used for radio communication with the tunable passive antennas;
one or more additional variables, each of the additional variables lying in a set of additional variables, the elements of the set of additional variables comprising: communication type variables which indicate whether a radio communication session is a voice communication session, a data communication session or another type of communication session; a speakerphone mode activation indicator; a speaker activation indicator; variables obtained using one or more accelerometers; user identity variables which depend on the identity of the current user; reception quality variables; and emission quality variables.

It is possible that at least one of the one or more localization variables is an output of a sensor responsive to a pressure exerted by a part of a human body. Thus, it is possible that at least one of the one or more localization variables is the output of a circuit comprising a switch using a single pressure non-locking mechanical system, the state of which changes while a sufficient pressure is exerted by a part of a human body. It is also possible that at least one of the one or more localization variables is the output of a circuit comprising another type of electromechanical sensor responsive to a pressure exerted by a part of a human body, for instance a microelectromechanical sensor (MEMS sensor).

It is possible that at least one of the one or more localization variables is an output of a proximity sensor, such as a proximity sensor dedicated to the detection of a human body. Such a proximity sensor may for instance be a capacitive proximity sensor, or an infrared proximity sensor using reflected light intensity measurements, or an infrared proximity sensor using time-of-flight measurements, which are well known to specialists.

It is possible that the set of the possible values of at least one of the one or more localization variables is a finite set. It is possible that at least one of the one or more localization variables is a binary variable, that is to say such that the set of the possible values of said at least one of the one or more localization variables has exactly two elements. For instance, a capacitive proximity sensor dedicated to the detection of a human body (for instance the device SX9300 of Semtech) can be used to obtain a binary variable, which indicates whether or not a human body has been detected near a zone of the apparatus for radio communication. It is possible that the set of the possible values of any one of the one or more localization variables is a finite set. However, it is possible that the set of the possible values of at least one of the one or more localization variables is an infinite set, and it is possible that the set of the possible values of at least one of the one or more localization variables is a continuous set.

It is possible that the set of the possible values of at least one of the one or more localization variables has at least three elements. For instance, an infrared proximity sensor using time-of-flight measurements and dedicated to the assessment of the distance to a human body (for instance the device VL6180 of STMicroelectronics) can be used to obtain a localization variable such that the set of the possible values of the localization variable has three or more elements, one of the values meaning that no human body has been detected, each of the other values corresponding to a different distance between a zone of the apparatus for radio communication and the nearest detected part of a human body. It is possible that the set of the possible values of any one of the one or more localization variables has at least three elements.

It is possible that at least one of the one or more localization variables is an output of a sensor which is not dedicated to human detection. For instance, it is possible that at least one of the one or more localization variables is determined by a change of state of a switch of a keypad or keyboard, which is indicative of the position of a human finger. For instance, it is possible that at least one of the one or more localization variables is determined by a change of state of an output of a touchscreen, which is indicative of the position of a human finger. Such a touchscreen may use any one of the available technologies, such as a resistive touchscreen, a capacitive touchscreen or a surface acoustic wave touchscreen, etc.

It is said above that each of the one or more localization variables depends on the distance between a part of a human body and a zone of the apparatus for radio communication. This must be interpreted as meaning: each of the one or more localization variables is such that there exists at least one configuration in which the distance between a part of a human body and a zone of the apparatus for radio communication has an effect on said each of the one or more localization variables. However, it is possible that there exist one or more configurations in which the distance between a part of a human body and a zone of the apparatus for radio communication has no effect on said each of the one or more localization variables. For instance, the distance between a part of a human body and a zone of the apparatus for radio communication has no effect on a switch, in a configuration in which no force is directly or indirectly exerted by the human body on the switch. For instance, the distance between a part of a human body and a zone of the apparatus for radio communication has no effect on a proximity sensor if the human body is out of the proximity sensor's range.

The elements of said set of additional variables may further comprise one or more variables which are different from the localization variables and which characterize the grip with which a user is holding the apparatus for radio communication.

Each of the one or more configuration instructions may for instance be determined using a lookup table.

Each of the one or more configuration instructions may be of any type of digital message. Each of the one or more antenna adjustment instructions and each of the one or more tuning unit adjustment instructions may be of any type of digital message. The one or more configuration instructions, the one or more antenna adjustment instructions and the one or more tuning unit adjustment instructions are delivered during several adjustment sequences. The transmission and signal processing unit begins an adjustment sequence when one or more configuration instructions are delivered. The transmission and signal processing unit ends the adjustment sequence when the last tuning unit adjustment instruction of the adjustment sequence has been delivered. The duration of an adjustment sequence is less than 100 microseconds.

In order to respond to variations in the electromagnetic characteristics of the volume surrounding the tunable passive antennas and/or in the frequency of operation, adjustment sequences may take place repeatedly. For instance, a new adjustment sequence may start periodically, for instance every 10 milliseconds.

Eleventh Embodiment

As a eleventh embodiment of the invention, given by way of non-limiting example, we consider a method for automatically adjusting one or more tunable passive antennas and a single-input-port and single-output-port tuning unit, the single-input-port and single-output-port tuning unit having an input port and an output port, the one or more tunable passive antennas and the single-input-port and single-output-port tuning unit being parts of an apparatus for radio communication, the apparatus for radio communication allowing, at a given frequency, a transfer of power from the input port to an electromagnetic field radiated by the one or more tunable passive antennas, the method comprising the steps of:

applying an excitation to the input port, the excitation having a carrier frequency;

sensing one or more electrical variables at the output port while the excitation is applied, to obtain two or more "sensing unit output signals", each of the sensing unit output signals being mainly determined by at least one of the one or more electrical variables sensed at the output port;

estimating q real quantities depending on an impedance seen by the output port, where q is an integer greater than or equal to 2, by utilizing the sensing unit output signals, the q real quantities depending on an impedance seen by the output port being such that they are sufficient for allowing a computation of a real part and an imaginary part of the impedance seen by the output port;

generating one or more "antenna control signals" as a function of one or more of the q real quantities depending on an impedance seen by the output port and as a function of the carrier frequency, each of the one or more tunable passive antennas comprising at least one antenna control device having at least one parameter having an effect on one or more characteristics of said each of the one or more tunable passive antennas, said at least one parameter being adjustable by electrical means, said at least one parameter being mainly determined by at least one of the one or more antenna control signals;

measuring, at one or more locations in the single-input-port and single-output-port tuning unit, a temperature, to obtain one or more "temperature signals", each of the one or more temperature signals being mainly determined by one or more of the temperatures at said one or more locations;

generating one or more "tuning control signals", as a function of one or more of said q real quantities depending on an impedance seen by the output port and as a function of said one or more temperature signals, the single-input-port and single-output-port tuning unit comprising p adjustable impedance devices, where p is an integer greater than or equal to one, the p adjustable impedance devices being referred to as "the one or more adjustable impedance devices of the tuning unit" and being such that, at the given frequency, each of the one or more adjustable impedance devices of the tuning unit has a reactance, the reactance of any one of the one or more adjustable impedance devices of the tuning unit being adjustable by electrical means, the reactance of any one of the one or more adjustable impedance devices of the tuning unit being mainly determined by at least one of the one or more tuning control signals, the reactance of any one of the one or more adjustable impedance devices of the tuning unit having an influence on an impedance presented by the input port.

The specialist understands that open-loop control is utilized to generate the one or more tuning control signals. The specialist understands that, for this reason, it is advantageous to take into account said one or more temperature signals to generate the one or more tuning control signals. The specialist understands how to generate the one or more tuning control signals as a function of one or more of said q real quantities depending on an impedance seen by the output port and as a function of said one or more temperature signals.

It is possible that the one or more tuning control signals are generated as a function of the carrier frequency (or, equivalently, of the selected frequency), as a function of one or more of said q real quantities depending on an impedance seen by the output port and as a function of said one or more temperature signals.

Figure 13:
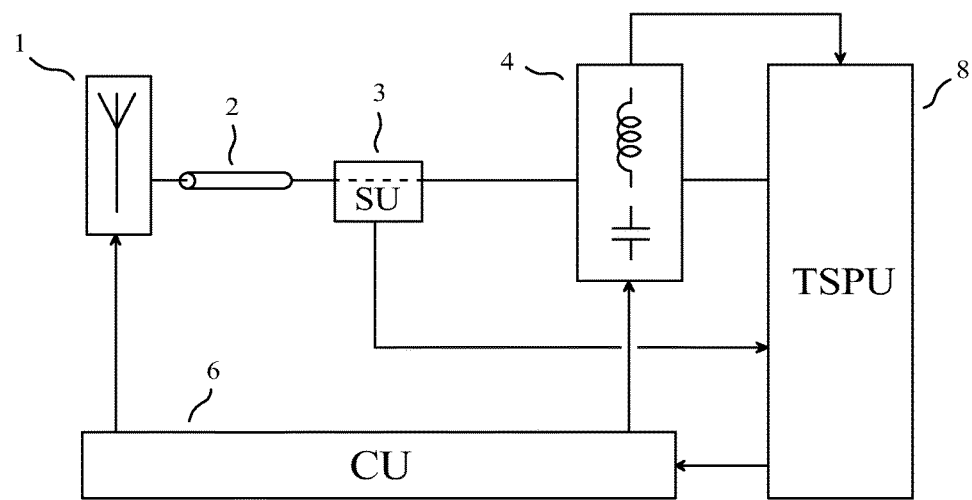
FIG. 13 shows a block diagram of an apparatus for radio communication of the invention (eleventh embodiment)

We have represented in FIG. 13 the block diagram of an apparatus for radio communication implementing this method, the apparatus for radio communication comprising:

a tunable passive antenna (1), the tunable passive antenna comprising at least one antenna control device, said at least one antenna control device having at least one parameter having an effect on one or more characteristics of the tunable passive antenna, said at least one parameter being adjustable by electrical means;

a feeder (2);

a single-input-port and single-output-port tuning unit (4) having an input port and an output port, the single-input-port and single-output-port tuning unit comprising p adjustable impedance devices, where p is an integer greater than or equal to 2, the p adjustable impedance devices being referred to as "the one or more adjustable impedance devices of the tuning unit" and being such that, at a given frequency, each of the one or more adjustable impedance devices of the tuning unit has a reactance, the reactance of any one of the one or more adjustable impedance devices of the tuning unit being adjustable by electrical means, the single-input-port and single-output-port tuning unit comprising a temperature measurement device which measures, at one or more locations in the single-input-port and single-output-port tuning unit, a temperature, to obtain one or more "temperature signals", each of the one or more temperature signals being mainly determined by one or more of the temperatures at said one or more locations;

a sensing unit (3) delivering two "sensing unit output signals", each of the sensing unit output signals being mainly determined by one or more electrical variables sensed at the output port while an excitation is applied to the input port;

a transmission and signal processing unit (8), the transmission and signal processing unit applying the excitation to the input port, the excitation having a carrier frequency, the transmission and signal processing unit estimating q real quantities depending on an impedance seen by the output port, where q is an integer greater than or equal to two, by utilizing the sensing unit output signals, the q real quantities depending on an impedance seen by the output port being such that they are sufficient for allowing a computation of a real part of the impedance seen by the output port and of an imaginary part of the impedance seen by the output port, the transmission and signal processing unit delivering one or more "antenna adjustment instructions", the one or more antenna adjustment instructions being determined as a function of one or more of said q real quantities depending on an impedance seen by the output port and as a function of the carrier frequency, the transmission and signal processing unit delivering one or more "tuning unit adjustment instructions", the one or more tuning unit adjustment instructions being determined as a function of said one or more temperature signals and as a function of one or more of said q real quantities depending on an impedance seen by the output port; and a control unit (6) similar to the one used in the first embodiment, the control unit delivering one or more "antenna control signals" to the tunable passive antenna, the control unit delivering one or more "tuning control signals" to the single-input-port and single-output-port tuning unit.

It is possible that the one or more tuning unit adjustment instructions are determined as a function of the carrier frequency (or, equivalently, of the selected frequency), as a function of one or more of said q real quantities depending on an impedance seen by the output port and as a function of said one or more temperature signals.

Twelfth Embodiment

The twelfth embodiment of a device of the invention, given by way of non-limiting example, also corresponds to the apparatus for radio communication shown in FIG. 13, and all explanations provided for the eleventh embodiment are applicable to this twelfth embodiment.

Figure 14:
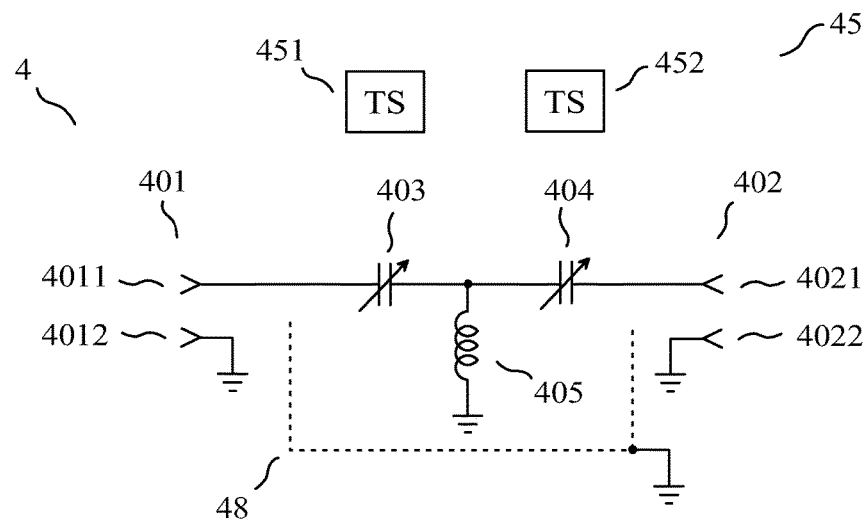
FIG. 14 shows a schematic diagram of a single-input-port and single-output-port tuning unit, which may be used in the apparatus for radio communication shown in FIG. 13 (twelfth embodiment)

We have represented in FIG. 14 the single-input-port and single-output-port tuning unit (4) used in this twelfth embodiment. This single-input-port and single-output-port tuning unit comprises:

an output port (401) having two terminals (4011) (4012), the output port being single-ended;

an input port (402) having two terminals (4021) (4022), the input port being single-ended;

one of the one or more adjustable impedance devices of the tuning unit (403), presenting a negative reactance and having a terminal connected to a terminal of the output port;

one of the one or more adjustable impedance devices of the tuning unit (404), presenting a negative reactance and having a terminal connected to a terminal of the input port;

a winding (405), having a first terminal coupled to ground, and having a second terminal coupled to a terminal of each of the one or more adjustable impedance devices of the tuning unit (403) (404);

a temperature measurement device (45) comprising two temperature sensors (451) (452), the temperature measurement device measuring, at the location of each of the temperature sensors, a temperature, to obtain one or more temperature signals, each of the one or more temperature signals being mainly determined by the temperature at the location of one of the temperature sensors; and an electromagnetic screen (48), which is grounded.

All said adjustable impedance devices of the tuning unit (403) (404) are adjustable by electrical means, but the circuits and the control links needed to adjust the reactance of each of the one or more adjustable impedance devices of the tuning unit are not shown in FIG. 14. The links needed to power feed the temperature sensors (451) (452) and to carry said one or more temperature signals are not shown in FIG. 14.

Experimental results have shown that the electromagnetic characteristics of the volume surrounding the single-input-port and single-output-port tuning unit often influence $Z_U$. The specialist understands that this phenomenon may be detrimental to the apparatus for radio communication of the invention, because open-loop control is utilized to generate the one or more tuning control signals. Experimental results have shown that this phenomenon may be mitigated by reducing the variable electromagnetic field produced by the single-input-port and single-output-port tuning unit outside the single-input-port and single-output-port tuning unit. In FIG. 14, an appropriate reduction of this electromagnetic field is provided by the electromagnetic screen (48), which may also be referred to as electromagnetic shield, and which is connected to a ground plane of the printed circuit board on which the single-input-port and single-output-port tuning unit is built.

A first one of the temperature sensors (451) is located near a first one of the one or more adjustable impedance devices of the tuning unit (403), in such a way that it measures a temperature which is close to the temperature of said first one of the one or more adjustable impedance devices of the tuning unit. A second one of the temperature sensors (452) is located near a second one of the one or more adjustable impedance devices of the tuning unit (404), in such a way that it measures a temperature which is close to the temperature of said second one of the one or more adjustable impedance devices of the tuning unit. In this manner, the one or more temperature signals provide information on the temperatures of each of the one or more adjustable impedance devices of the tuning unit, which may be different from one another. The specialist understands that these temperatures may in particular be different if a significant high-frequency power is applied to the input port, because the powers dissipated in the one or more adjustable impedance devices of the tuning unit are typically different from one another.

In this twelfth embodiment, two temperature sensors are used, to measure, at two locations in the single-input-port and single-output-port tuning unit, a temperature. Thus, it is possible that the number of locations in the single-input-port and single-output-port tuning unit, at which a temperature is measured, is greater than or equal to 2.

Thirteenth Embodiment

The thirteenth embodiment of a device of the invention, given by way of non-limiting example, also corresponds to the apparatus for radio communication shown in FIG. 13, and all explanations provided for the eleventh embodiment are applicable to this thirteenth embodiment.

Figure 15:
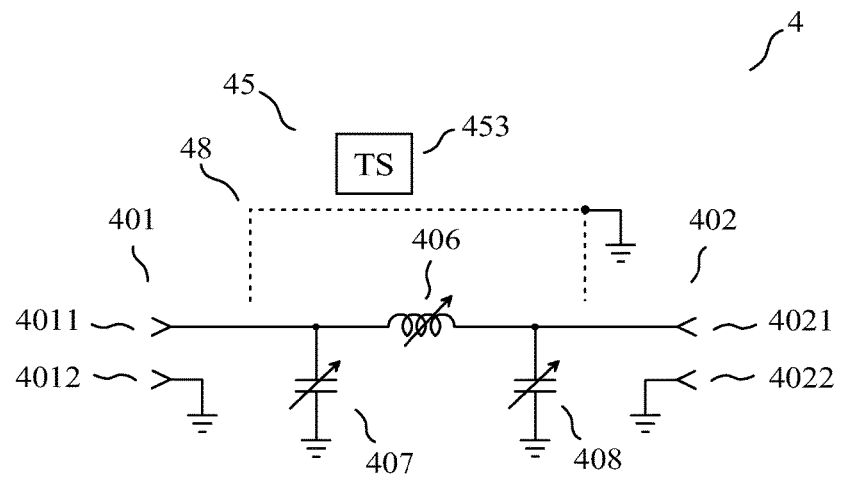
FIG. 15 shows a schematic diagram of a single-input-port and single-output-port tuning unit, which may be used in the apparatus for radio communication shown in FIG. 13 (thirteenth embodiment)

We have represented in FIG. 15 the single-input-port and single-output-port tuning unit (4) used in this thirteenth embodiment. This single-input-port and single-output-port tuning unit comprises:

an output port (401) having two terminals (4011) (4012), the output port being single-ended;
an input port (402) having two terminals (4021) (4022), the input port being single-ended;
one of the one or more adjustable impedance devices of the tuning unit (406), presenting a positive reactance, having a first terminal connected to a terminal of the input port, and having a second terminal connected to a terminal of the output port;
one of the one or more adjustable impedance devices of the tuning unit (407), presenting a negative reactance and connected in parallel with the output port;
one of the one or more adjustable impedance devices of the tuning unit (408), presenting a negative reactance and connected in parallel with the input port;
a temperature measurement device (45) comprising a single temperature sensor (453), the temperature measurement device measuring, at the location of the temperature sensor, a temperature, to obtain one or more temperature signals, each of the one or more temperature signals being mainly determined by the temperature at the location of the temperature sensor; and
an electromagnetic screen (48), which is grounded.

All said adjustable impedance devices of the tuning unit (406) (407) (408) are adjustable by electrical means, but the circuits and the control links needed to adjust the reactance of each of the one or more adjustable impedance devices of the tuning unit are not shown in FIG. 15. The links needed to power feed the temperature sensor (453) and to carry said one or more temperature signals are not shown in FIG. 15.

In this thirteenth embodiment, the electromagnetic screen (48) forms an enclosure containing all said adjustable impedance devices of the tuning unit (406) (407) (408), in which the temperature is almost uniform. This is why a single temperature sensor is used.

In this thirteenth embodiment, three adjustable impedance devices of the tuning unit are used. Thus, it is possible that the number of adjustable impedance devices of the tuning unit is greater than or equal to 3.

Fourteenth Embodiment

The fourteenth embodiment of a device of the invention, given by way of non-limiting example, also corresponds to the apparatus for radio communication shown in FIG. 13, and all explanations provided for the eleventh embodiment are applicable to this fourteenth embodiment.

Figure 16:
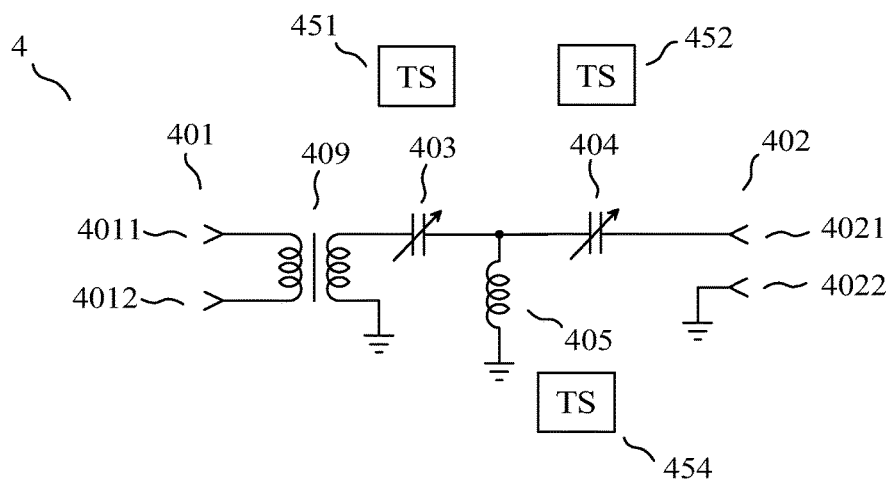
FIG. 16 shows a schematic diagram of a single-input-port and single-output-port tuning unit, which may be used in the apparatus for radio communication shown in FIG. 13 (fourteenth embodiment)

We have represented in FIG. 16 the single-input-port and single-output-port tuning unit (4) used in this fourteenth embodiment. This single-input-port and single-output-port tuning unit comprises:

an output port (401) having two terminals (4011) (4012), the output port being symmetrical (i.e., balanced);
an input port (402) having two terminals (4021) (4022), the input port being single-ended;
a transformer (409);
two adjustable impedance devices of the tuning unit (403) (404), each presenting a negative reactance;
a coil (405); and
a temperature measurement device comprising three passive temperature sensors (451) (452) (454), the temperature measurement device measuring, at the location of each of the temperature sensors, a temperature, to obtain one or more temperature signals, each of the one or more temperature signals being mainly determined by the temperature at the location of one of the temperature sensors.

All said adjustable impedance devices of the tuning unit (403) (404) are adjustable by electrical means, but the circuits and the control links needed to adjust the reactance of each of the one or more adjustable impedance devices of the tuning unit are not shown in FIG. 16. The links needed to carry said one or more temperature signals are not shown in FIG. 16.

A first one of the temperature sensors (451) is located near a first one of the one or more adjustable impedance devices of the tuning unit (403), in such a way that it measures a temperature which is close to the temperature of said first one of the one or more adjustable impedance devices of the tuning unit. A second one of the temperature sensors (452) is located near a second one of the one or more adjustable impedance devices of the tuning unit (404), in such a way that it measures a temperature which is close to the temperature of said second one of the one or more adjustable impedance devices of the tuning unit. A third one of the temperature sensors (454) is located near the coil (405), in such a way that it measures a temperature which is close to the temperature of the coil. In this manner, the one or more temperature signals provide information on the temperatures of the coil and of each of the one or more adjustable impedance devices of the tuning unit, which may be different from one another. The specialist understands that these temperatures may in particular be different if a significant high-frequency power is applied to the input port and transferred from the input port to the output port. The coil used in this fourteenth embodiment comprises a ferrite core, so that its inductance and its losses depend on the coil's temperature. This is why the third one of the temperature sensors (454) is present.

In this fourteenth embodiment, the transformer (409) is used to obtain a symmetrical output port. Such a transformer is often referred to as a balun.

More generally, according to the invention, it is possible that the input port and/or the output port of the single-input-port and single-output-port tuning unit are single-ended, and it is possible that the input port and/or the output port of the single-input-port and single-output-port tuning unit are balanced or symmetrical.

In this fourteenth embodiment, three temperature sensors are used, to measure, at three locations in the single-input-port and single-output-port tuning unit, a temperature. Thus, it is possible that the number of locations in the single-input-port and single-output-port tuning unit, at which a temperature is measured, is greater than or equal to 3.

Fifteenth Embodiment

Figure 17:
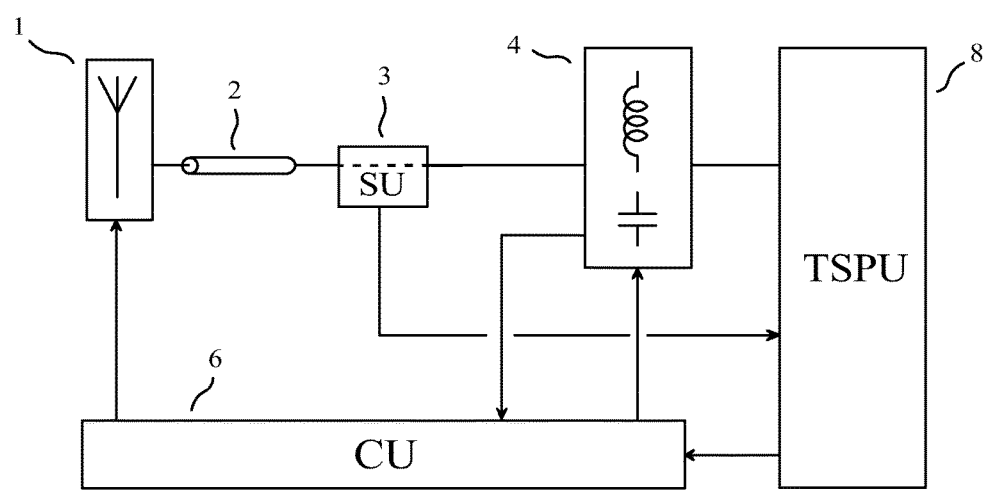
FIG. 17 shows a block diagram of an apparatus for radio communication of the invention (fifteenth embodiment).

As a fifteenth embodiment of a device of the invention, given by way of non-limiting example, we have represented in FIG. 17 the block diagram of an apparatus for radio communication implementing the method disclosed in the eleventh embodiment, the apparatus for radio communication comprising:
a tunable passive antenna (1), the tunable passive antenna comprising at least one antenna control device, said at least one antenna control device having at least one parameter having an effect on one or more characteristics of the tunable passive antenna, said at least one parameter being adjustable by electrical means;
a feeder (2);
a single-input-port and single-output-port tuning unit (4) having an input port and an output port, the single-input-port and single-output-port tuning unit comprising p adjustable impedance devices, where p is an integer greater than or equal to 2, the p adjustable impedance devices being referred to as "the one or more adjustable impedance devices of the tuning unit" and being such that, at a given frequency, each of the one or more adjustable impedance devices of the tuning unit has a reactance, the reactance of any one of the one or more adjustable impedance devices of the tuning unit being adjustable by electrical means, the single-input-port and single-output-port tuning unit comprising a temperature measurement device which measures, at one or more locations in the single-input-port and single-output-port tuning unit, a temperature, to obtain one or more "temperature signals", each of the one or more temperature signals being determined by one or more of the temperatures at said one or more locations;
a sensing unit (3) delivering two "sensing unit output signals", each of the sensing unit output signals being determined by one or more electrical variables sensed at the output port;
a transmission and signal processing unit (8), the transmission and signal processing unit applying an excitation to the input port, the excitation having a carrier frequency, the transmission and signal processing unit estimating q real quantities depending on an impedance seen by the output port, where q is an integer greater than or equal to two, by utilizing the sensing unit output signals, the q real quantities depending on an impedance seen by the output port being such that they are sufficient for allowing a computation of a real part of the impedance seen by the output port and of an imaginary part of the impedance seen by the output port, the transmission and signal processing unit delivering one or more "antenna adjustment instructions", the one or more antenna adjustment instructions being determined as a function of one or more of said q real quantities depending on an impedance seen by the output port and as a function of the carrier frequency, the transmission and signal processing unit delivering one or more "tuning unit adjustment instructions", the one or more tuning unit adjustment instructions being determined as a function of one or more of said q real quantities depending on an impedance seen by the output port and as a function of the carrier frequency; and
a control unit (6), the control unit receiving the one or more antenna adjustment instructions, the control unit delivering one or more "antenna control signals" to the tunable passive antenna, each of the one or more antenna control signals being determined as a function of at least one of the one or more antenna adjustment instructions, each said at least one parameter of each said at least one antenna control device of the tunable passive antenna being mainly determined by at least one of the one or more antenna control signals, the control unit receiving the one or more temperature signals and the one or more tuning unit adjustment instructions, the control unit delivering one or more "tuning control signals" to the single-input-port and single-output-port tuning unit, each of the one or more tuning control signals being determined as a function of at least one of the one or more temperature signals and as a function of at least one of the one or more tuning unit adjustment instructions, the reactance of each of the one or more adjustable impedance devices of the tuning unit being mainly determined by at least one of the one or more tuning control signals.

INDICATIONS ON INDUSTRIAL APPLICATIONS

The method of the invention is suitable for optimally, automatically and quickly adjusting one or more tunable passive antennas and a single-input-port and single-output-port tuning unit. The apparatus for radio communication of the invention can optimally, automatically and quickly adjust its one or more tunable passive antennas and its single-input-port and single-output-port tuning unit.

The apparatus for radio communication of the invention may for instance be a radio receiver, a radio transmitter, or a radio transceiver. The invention is particularly suitable for mobile radio transmitters and mobile radio transceivers, for instance those used in portable radiotelephones or portable computers, which may be subject to fast variations in the electromagnetic characteristics of the medium surrounding the one or more tunable passive antennas being used for radio communication.

The invention claimed is:
1. A method for automatically adjusting one or more tunable passive antennas and a single-input-port and single- output-port tuning unit, the single-input-port and single-output-port tuning unit having an input port and an output port, the one or more tunable passive antennas and the single-input-port and single-output-port tuning unit being parts of an apparatus for radio communication, the apparatus for radio communication allowing, at a given frequency, a transfer of power from the input port to an electromagnetic field radiated by the one or more tunable passive antennas, the method comprising the steps of:

applying an excitation to the input port;

estimating q real quantities depending on an impedance seen by the output port, where q is an integer greater than or equal to one, by utilizing said excitation;

generating one or more antenna control signals, as a function of one or more of said q real quantities depending on an impedance seen by the output port, each of the one or more tunable passive antennas comprising at least one antenna control device, said at least one antenna control device having at least one parameter having an effect on one or more characteristics of said each of the one or more tunable passive antennas, said at least one parameter being adjustable by electrical means, said at least one parameter being mainly determined by at least one of the one or more antenna control signals; and generating one or more tuning control signals, as a function of one or more of said q real quantities depending on an impedance seen by the output port, the single-input-port and single-output-port tuning unit comprising p adjustable impedance devices, where p is an integer greater than or equal to one, the p adjustable impedance devices being referred to as the one or more adjustable impedance devices of the tuning unit and being such that, at the given frequency, each of the one or more adjustable impedance devices of the tuning unit has a reactance, the reactance of any one of the one or more adjustable impedance devices of the tuning unit being adjustable by electrical means, the reactance of any one of the one or more adjustable impedance devices of the tuning unit being mainly determined by at least one of the one or more tuning control signals.

2. The method of claim 1, wherein, at a given time, the output port is coupled to one and only one of the one or more tunable passive antennas.

3. The method of claim 1, wherein the single-input-port and single-output-port tuning unit is such that, at said given frequency, if the impedance seen by the output port is equal to a given impedance, then the reactance of any one of the one or more adjustable impedance devices of the tuning unit has an influence on an impedance presented by the input port.

4. The method of claim 1, wherein p is greater than or equal to two.

5. The method of claim 1, wherein q is greater than or equal to two, and wherein the q real quantities depending on an impedance seen by the output port are sufficient for allowing a computation of a real part of the impedance seen by the output port and of an imaginary part of the impedance seen by the output port.

6. The method of claim 1, wherein open-loop control is utilized to generate the one or more tuning control signals.

7. The method of claim 1, further comprising the step of measuring, at one or more locations in the single-input-port and single-output-port tuning unit, a temperature, to obtain one or more temperature signals, each of the one or more temperature signals being mainly determined by one or more of the temperatures at said one or more locations, and wherein the one or more tuning control signals are generated as a function of one or more of said q real quantities depending on an impedance seen by the output port and as a function of said one or more temperature signals.

8. The method of claim 1, wherein a lookup table is used to generate the one or more antenna control signals, as a function of a selected frequency and of the q real quantities depending on an impedance seen by the output port, and wherein the excitation has a carrier frequency which is equal to the selected frequency.

9. The method of claim 1, wherein a lookup table is used to generate the one or more tuning control signals, as a function of a selected frequency and of the q real quantities depending on an impedance seen by the output port, and wherein the excitation has a carrier frequency which is equal to the selected frequency.

10. An apparatus for radio communication comprising:

one or more tunable passive antennas, each of the one or more tunable passive antennas comprising at least one antenna control device, said at least one antenna control device having at least one parameter having an effect on one or more characteristics of said each of the one or more tunable passive antennas, said at least one parameter being adjustable by electrical means;

a single-input-port and single-output-port tuning unit having an input port and an output port, the apparatus for radio communication allowing, at a given frequency, a transfer of power from the input port to an electromagnetic field radiated by the one or more tunable passive antennas, the single-input-port and single-output-port tuning unit comprising p adjustable impedance devices, where p is an integer greater than or equal to one, the p adjustable impedance devices being referred to as the one or more adjustable impedance devices of the tuning unit and being such that, at the given frequency, each of the one or more adjustable impedance devices of the tuning unit has a reactance, the reactance of any one of the one or more adjustable impedance devices of the tuning unit being adjustable by electrical means;

a sensing unit delivering one or more sensing unit output signals, each of the one or more sensing unit output signals being mainly determined by one or more electrical variables;

a transmission and signal processing unit, the transmission and signal processing unit applying an excitation to the input port, the transmission and signal processing unit estimating q real quantities depending on an impedance seen by the output port, where q is an integer greater than or equal to one, by utilizing the one or more sensing unit output signals, the transmission and signal processing unit delivering one or more antenna adjustment instructions, the one or more antenna adjustment instructions being determined as a function of one or more of said q real quantities depending on an impedance seen by the output port, the transmission and signal processing unit delivering one or more tuning unit adjustment instructions, the one or more tuning unit adjustment instructions being determined as a function of one or more of said q real quantities depending on an impedance seen by the output port; and a control unit, the control unit delivering one or more antenna control signals to the one or more tunable passive antennas, each of the one or more antenna control signals being determined as a function of at least one of the one or more antenna adjustment instructions, each said at least one parameter of each said at least one antenna control device of each of the one or more tunable passive antennas being mainly determined by at least one of the one or more antenna control signals, the control unit delivering one or more tuning control signals to the single-input-port and single-output-port tuning unit, each of the one or more tuning control signals being determined as a function of at least one of the one or more tuning unit adjustment instructions, the reactance of each of the one or more adjustable impedance devices of the tuning unit being mainly determined by at least one of the one or more tuning control signals.

11. The apparatus for radio communication of claim 10, wherein, at a given time, the output port is coupled to one and only one of the one or more tunable passive antennas.

12. The apparatus for radio communication of claim 10, wherein the single-input-port and single-output-port tuning unit is such that, at said given frequency, if the impedance seen by the output port is equal to a given impedance, then the reactance of any one of the one or more adjustable impedance devices of the tuning unit has an influence on an impedance presented by the input port.

13. The apparatus for radio communication of claim 10, wherein p is greater than or equal to two.

14. The apparatus for radio communication of claim 10, wherein q is greater than or equal to two, and wherein the q real quantities depending on an impedance seen by the output port are sufficient for allowing a computation of a real part of the impedance seen by the output port and of an imaginary part of the impedance seen by the output port.

15. The apparatus for radio communication of claim 10, wherein the one or more sensing unit output signals comprise: a first sensing unit output signal proportional to a first electrical variable, the first electrical variable being a voltage across the output port; and a second sensing unit output signal proportional to a second electrical variable, the second electrical variable being a current flowing out of the output port.

16. The apparatus for radio communication of claim 10, wherein the one or more sensing unit output signals comprise: a first sensing unit output signal proportional to a first electrical variable, the first electrical variable being an incident voltage at the output port; and a second sensing unit output signal proportional to a second electrical variable, the second electrical variable being a reflected voltage at the output port.

17. The apparatus for radio communication of claim 10, wherein open-loop control is utilized to generate the one or more tuning control signals.

18. The apparatus for radio communication of claim 10, wherein the single-input-port and single-output-port tuning unit comprises a temperature measurement device which measures, at one or more locations in the single-input-port and single-output-port tuning unit, a temperature, to obtain one or more temperature signals, each of the one or more temperature signals being mainly determined by one or more of the temperatures at said one or more locations, and wherein the one or more tuning control signals are generated as a function of one or more of said q real quantities depending on an impedance seen by the output port and as a function of said one or more temperature signals.

19. The apparatus for radio communication of claim 10, wherein a lookup table is used to deliver the one or more antenna adjustment instructions, as a function of a selected frequency and of the q real quantities depending on an impedance seen by the output port, and wherein the excitation has a carrier frequency which is equal to the selected frequency.

20. The apparatus for radio communication of claim 10, wherein a lookup table is used to deliver the one or more tuning unit adjustment instructions, as a function of a selected frequency and of the q real quantities depending on an impedance seen by the output port, and wherein the excitation has a carrier frequency which is equal to the selected frequency.

* * * * *